United States Patent
Sato

(10) Patent No.: US 7,551,264 B2
(45) Date of Patent: Jun. 23, 2009

(54) EXPOSURE APPARATUS

(75) Inventor: Mitsuya Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 11/764,371

(22) Filed: Jun. 18, 2007

(65) Prior Publication Data

US 2007/0291242 A1 Dec. 20, 2007

Related U.S. Application Data

(62) Division of application No. 11/449,812, filed on Jun. 9, 2006, now Pat. No. 7,245,349, which is a division of application No. 11/336,907, filed on Jan. 23, 2006, now Pat. No. 7,079,222, which is a division of application No. 11/186,897, filed on Jul. 22, 2005, now Pat. No. 7,050,153, which is a division of application No. 10/824,513, filed on Apr. 15, 2004, now Pat. No. 7,009,683.

(30) Foreign Application Priority Data

Apr. 18, 2003 (JP) ............................... 2003-114233

(51) Int. Cl.
*G03B 27/58* (2006.01)
*G03B 27/62* (2006.01)
(52) U.S. Cl. .......................................... 355/72; 355/75
(58) Field of Classification Search .................. 355/53, 355/72–76; 310/10, 12; 250/492.2, 548
See application file for complete search history.

(56) References Cited

U.S. PATENT DOCUMENTS

| | | | |
|---|---|---|---|
| 4,496,239 A | 1/1985 | Isohata et al. | 355/30 |
| 4,659,227 A | 4/1987 | Sato et al. | 356/401 |
| 4,747,608 A | 5/1988 | Sato et al. | 279/1 E |
| 4,870,288 A | 9/1989 | Abuku et al. | 250/548 |
| 5,270,771 A | 12/1993 | Sato | 355/53 |
| 5,499,099 A | 3/1996 | Sato et al. | 356/400 |
| 5,504,407 A | 4/1996 | Wakui et al. | 318/568.17 |
| 5,511,930 A | 4/1996 | Sato et al. | 414/676 |
| 5,585,925 A | 12/1996 | Sato et al. | 356/401 |
| 5,608,492 A | 3/1997 | Sato | 355/68 |
| 5,715,064 A | 2/1998 | Lin | 356/401 |
| 5,753,926 A | 5/1998 | Sato | 250/548 |
| 5,757,149 A | 5/1998 | Sato et al. | 318/135 |
| 5,993,081 A | 11/1999 | Itoh et al. | 396/611 |
| 6,341,007 B1 | 1/2002 | Nishi et al. | 355/53 |
| 6,400,441 B1 | 6/2002 | Nishi et al. | 355/53 |
| 6,437,463 B1 | 8/2002 | Hazelton et al. | 310/12 |

(Continued)

FOREIGN PATENT DOCUMENTS

JP 10-163098 6/1998

(Continued)

*Primary Examiner*—Hung Henry Nguyen
(74) *Attorney, Agent, or Firm*—Fitzpatrick, Cella, Harper & Scinto

(57) ABSTRACT

Two independent fine adjustment stages are arranged on one coarse adjustment stage to simultaneously perform all of focus measurement and part of alignment measurement in parallel with an exposure operation. A method of transporting a wafer together with a chuck is adopted as a precondition. Alignment of a pattern on a wafer with a chuck is performed before the chuck is mounted on each fine adjustment stage.

3 Claims, 21 Drawing Sheets

U.S. PATENT DOCUMENTS

| | | | |
|---|---|---|---|
| 6,549,269 B1 | 4/2003 | Nishi et al. | 355/53 |
| 6,590,634 B1 | 7/2003 | Nishi et al. | 355/53 |
| 6,590,636 B2 | 7/2003 | Nishi | 355/53 |
| 6,778,258 B2 | 8/2004 | del Puerto et al. | 355/72 |
| 6,819,404 B2 | 11/2004 | Tanaka | 355/72 |
| 6,897,963 B1 * | 5/2005 | Taniguchi et al. | 356/500 |
| 2003/0002021 A1 | 1/2003 | Sato | 355/67 |
| 2004/0032575 A1 | 2/2004 | Nishi et al. | 355/53 |
| 2004/0165172 A1 | 8/2004 | Poon et al. | 355/72 |
| 2005/0005702 A1 | 1/2005 | Osuga | 73/760 |
| 2005/0151951 A1 * | 7/2005 | Hill | 355/67 |
| 2005/0236908 A1 | 10/2005 | Rivin | 310/10 |

FOREIGN PATENT DOCUMENTS

| | | |
|---|---|---|
| JP | 3045947 | 3/2000 |
| WO | WO 98/28665 | 7/1998 |

* cited by examiner

← OBSERVATION DIRECTION OF FIGS. 10B and 10C

1. MEASUREMENT OF FIRST WAFER 3. (MEASUREMENT OF THIRD TO (N-1)TH WAFERS) & (EXPOSURE OF SECOND TO (N-2)TH WAFERS)

4. (MEASUREMENT OF NTH WAFER) & (EXPOSURE OF (N-1)TH WAFER)

5. MEASUREMENT OF NTH WAFER

6. END PROCESS

→ End

EXPOSURE APPARATUS

This application is a divisional application of copending U.S. patent application Ser. No. 11/449,812, filed Jun. 9, 2006, which is a divisional application of U.S. patent application Ser. No. 11/336,907, filed Jan. 23, 2006, which issued on Jul. 18, 2006, as U.S. Pat. No. 7,079,222, which is a divisional of U.S. patent application Ser. No. 11/186,897, filed Jul. 22, 2005, which issued on May 23, 2006, as U.S. Pat. No. 7,050,153, and which is a divisional application of U.S. patent application Ser. No. 10/824,513, filed Apr. 15, 2004, which issued on Mar. 7, 2006, as U.S. Pat. No. 7,009,683.

FIELD OF THE INVENTION

The present invention relates to an exposure technique for use in a lithography process in the manufacture of a semiconductor device.

BACKGROUND OF THE INVENTION

FIG. 2A shows a typical arrangement of a conventional exposure apparatus.

In FIG. 2A, reference numeral 1 denotes a reticle; 2, a reticle stage for scanning the reticle 1; 3, a reticle stage guide of the reticle stage 2; 4, a projection system; 5, an alignment scope for measuring pattern positions; 6 and 7, focus detection systems (light projecting and light receiving units) of a focus measurement system for measuring the position of a wafer upper surface; 8, a wafer; 9, a chuck for holding the wafer; 10, a fine adjustment stage which can finely drive in the X, Y, Z, and θ (this represents rotation in a direction parallel to the X-Y plane (i.e., rotation about the Z axis) hereinafter) directions and in the tilt (this represents a tilt with respect to the X-Y plane hereinafter) direction; 11, a coarse adjustment stage which can drive the fine adjustment stage 10 in the X and Y directions; and 12, a wafer stage surface plate of the coarse adjustment stage 11.

In the conventional semiconductor exposure apparatus, the alignment scope 5 arranged adjacent to and at a distance BL from the projection system 4 measures the position of a pattern on the wafer 8. Then, the wafer 8 is fed by the coarse adjustment stage 11 to below the projection system 4. The reticle 1 and wafer 8 undergo a scan operation relative to the projection system 4 at a velocity of the magnification ratio of the projection system 4 such that a pattern on the reticle 1 is transferred onto a predetermined position on the wafer 8.

In the above-mentioned transfer, the focus measurement system measures the position of the upper surface of the wafer, and exposure operation is performed while the fine adjustment stage 10 performs sequential alignment in the focus direction such that the position of the upper surface of the wafer coincides with that of the image plane of the projection system 4.

The conventional semiconductor exposure apparatus has the following problems.

(1) Increase in Throughput

The conventional semiconductor exposure apparatus needs to measure the position of a pattern on the wafer 8 below the alignment scope 5 before exposure operation. This is one of the major factors which limits the throughput of the apparatus.

(2) Enhancement of Ease in Increasing Measurement Precision of Focus Detection System The conventional semiconductor exposure apparatus needs to arrange the focus measurement system for the wafer below the projection system 4, as described above. For this reason, it is becoming difficult in terms of the mounting space, e.g., to implement a multichannel detection system or to improve a detection optical system to increase the measurement precision of the focus measurement system.

(3) Relaxation of Constraints on Design of Projection System

In designing the projection system 4, the above-mentioned focus measurement system is arranged below the projection system and, thus, a large back focal distance is necessary. This imposes considerable constraints on the design of the projection system 4. Along with a recent increase in the numerical aperture (NA) of the projection system 4, this problem has become serious. The problem will become serious in a mirror projection system of a future EUV exposure apparatus as well.

(4) Facilitation of Cleaning Below Projection System

Recently, contamination from a resist has been perceived as a problem. To prevent this, a jet of clean air is provided below the projection system 4. However, the focus measurement system described above is also arranged below the projection system 4, and thus it is difficult to form a complete laminar flow of clean air.

(5) Facilitation of Chuck Cleaning

As future exposure apparatuses, semiconductor exposure apparatuses using an $F_2$ excimer laser or EUV light are being developed. In these semiconductor exposure apparatuses, the atmosphere for exposure light must be purged with nitrogen or must be evacuated to a vacuum. A semiconductor exposure apparatus used in such an environment needs to periodically extract a wafer chuck to the outer air side for cleaning. A conventional exposure apparatus, however, has no chuck transport function required for this operation.

To solve some problems of a conventional exposure apparatus, the following two methods are proposed. Their outlines will be described below.

(A) Place Two Coarse Adjustment Stages on Same Surface Plate

FIG. 2B shows the arrangement of improved method 1 in a conventional semiconductor exposure apparatus. Reference numeral 20 denotes an exposure wafer; 21, an exposure chuck; 22, an exposure fine adjustment stage; 23, an exposure coarse adjustment stage; 30, a measurement wafer; 31, a measurement chuck; 32, a measurement fine adjustment stage; and 33, a measurement coarse adjustment stage.

The semiconductor exposure apparatus according to improved method 1 has the two coarse adjustment stages, two fine adjustment stages, and the like. Exposure operation and measurement operations (alignment and focus measurements) can simultaneously and independently be performed for the wafers on the fine adjustment stages at exposure and measurement positions.

When predetermined processes end at the exposure and measurement positions, the fine adjustment stages are separated from the coarse adjustment stages and are interchanged. The wafer having undergone a measurement operation is moved to the exposure position for the exposure operation. Reference marks (not shown) are formed on the edges of the wafer chucks and are measured at the measurement and exposure positions. With this operation, measurement results (alignment and focus measurement results) at the measurement position are accurately reflected in exposure, and accurate alignment and focus are implemented at the exposure position.

Method 1 has advantages and disadvantages as follows.

(Advantages)

Exposure and measurement operations can be performed in parallel. If the time for the measurement operation is equal to or shorter than the time for the exposure operation, the measurement operation does not cause a decrease in throughput. Since enough time can be spared for the measurement operation, multipoint measurement or the like can be performed, and an increase in precision can be expected. Additionally, since a projection system and an alignment/focus measurement system are spaced apart from each other, constraints on the design of the projection system can be relaxed. Cleaning below the projection system is also facilitated.

(Disadvantages)

Independent operation of the two fine adjustment stages and two coarse adjustment stages increases the size of the entire stage and the complexity of a mechanism which interchanges the two fine adjustment stages. It is difficult to ensure a long term reliability and to perform replacement in a short time. Also, since the two stages operate independently of each other on one surface plate, their reaction forces make it difficult to keep the precision of scan synchronization between a reticle and wafers high at a high stage speed. Additionally, each stage basically has only a wafer transport function and requires considerable alterations to add the chuck unloading function described above.

Typical known examples of improved method 1 include PCT WO 98/28665, which is the corresponding publication of Japanese patent application number 2000-505958.

This known example discloses use of a counter mass to reduce effects of reaction forces generated by the independent operation of the two stages. Only one counter mass is used for the two stages, and it is difficult to completely remove the effects of the reaction forces.

As an example similar to the method shown in FIG. 2B, there is available the method discussed in Japanese Laid-Open No. 10-163098.

As in the above-mentioned known example, this known example has two stages capable of independent operation. The example proposes synchronization between the two stages in a specific operation for preventing any mutual interference between them and a reduction in size of the apparatus. This case may avoid any interference between the two stages and reduce the size of the apparatus. However, processing on one stage may be made to wait due to synchronization between the two stages, and a trade-off relationship is established between a reduction in size and an increase in throughput. Also, in this known example as well, the above-mentioned reaction force problem still remains unsolved.

As another example similar to the method shown in FIG. 2B, there is available the method discussed in Japanese Patent No. 3,045,947.

This known example is directed to a stepper. Similarly to the above-mentioned known example, the example has two stages capable of independent operation and proposes parallel stepwise operation of the two stages below exposure and measurement positions. This known example does not describe the structures of the two stages, and their details are unknown. Similarly to the method in FIG. 2B, it seems difficult to attain a stage performance as high as that of a single stage by the effects of the mutual reaction forces of the two stages.

(B) Two Completely Independent Stages

FIG. 2C shows the arrangement of improved method 2 in a conventional semiconductor exposure apparatus. Reference numeral 40 denotes an exposure wafer; 41, an exposure chuck; 42, an exposure fine adjustment stage; 43, an exposure coarse adjustment stage; 44, an exposure wafer stage surface plate; 50, a measurement wafer; 51, a measurement chuck; 52, a measurement fine adjustment stage; 53, a measurement coarse adjustment stage; and 54, a measurement wafer stage surface plate.

The semiconductor exposure apparatus using this method has two completely independent stages. After alignment and focus measurements on the measurement stage side, a wafer is loaded to the exposure stage side together with a chuck to perform exposure on the exposure stage side. As in improved method 1, reference marks (not shown) are formed on the edges of the chuck. The measurement and exposure stages measure the reference marks to accurately reflect alignment and focus measurement results on the measurement stage in exposure on the exposure stage. With this operation, accurate alignment and focus can be implemented.

Method 2 has advantages and disadvantages as follows.

(Advantages)

Method 2 basically has advantages similar to those of method 1. In this method, two stages including stage surface plates are completely independent, and they never exert reaction forces on each other. For this reason, even if the speed of each stage increases, the precision of scan synchronization between a reticle and a wafer can be kept high. Since method 2 basically adopts a wafer chuck transport method, it is relatively easy to implement the chuck unloading function.

(Disadvantages)

Since method 2 requires two sets of completely independent stages, the size of the apparatus increases. The lattices of the two sets of stages need to accurately coincide with each other. The two sets are slightly separated from each other, and it is more difficult than method 1 to cause the lattices to coincide with each other due to effects of the temperature, air pressure, gas molecule composition, humidity, and the like. Also, the method needs chuck transport. Since the two sets are separated from each other, it is necessary to hold a wafer so as to prevent the position of the wafer on a chuck from shifting from the chuck during the chuck transport.

SUMMARY OF THE INVENTION

The present invention has as its object to propose a method of solving the above-mentioned problems of conventional semiconductor exposure apparatuses and solving the above-mentioned problems of improved methods 1 and 2. More specifically, objects to be achieved by the present invention are as follows:

1. an increase in throughput;

2. facilitation of increasing the measurement precision of a focus detection system;

3. relaxation of constraints on the design of a projection system;

4. facilitation of cleaning below the projection system;

5. facilitation of chuck cleaning;

6. a reduction in size of the apparatus; and 7. facilitation of supporting a load lock.

The present invention eventually has as its object to implement a compact common platform which can be applied to various semiconductor exposure apparatuses whose exposure spaces are an outer air space, a nitrogen purged space, a vacuum space, or the like, can relax constraints on the design of the projection system and focus detection system, and can increase the speed and precision.

To solve the above-mentioned problems and to achieve the objects, according to the present invention, there is proposed a method of arranging two independent fine adjustment stages on one coarse adjustment stage and simultaneously performing all of focus measurement and part of alignment measurement in parallel with an exposure operation.

The present invention adopts a chuck transport method to easily implement the above-mentioned functions. The present invention proposes alignment of patterns on a wafer with a chuck before mounting the chuck on each fine adjustment stage.

According to the present invention, a more compact common platform, which can be applied to various semiconductor exposure apparatuses, can relax constraints on the design of exposure and measurement units, and can increase the speed and precision, can be implemented.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and therefore reference is made to the claims which follow the description for determining the scope of the invention.

DETAILED DESCRIPTION OF THE PREFERRED EMBODIMENTS

Embodiments of the present invention will be described below in detail with reference to the accompanying drawings.

[Outline of Present Invention (FIG. 1)]

Figure 1:
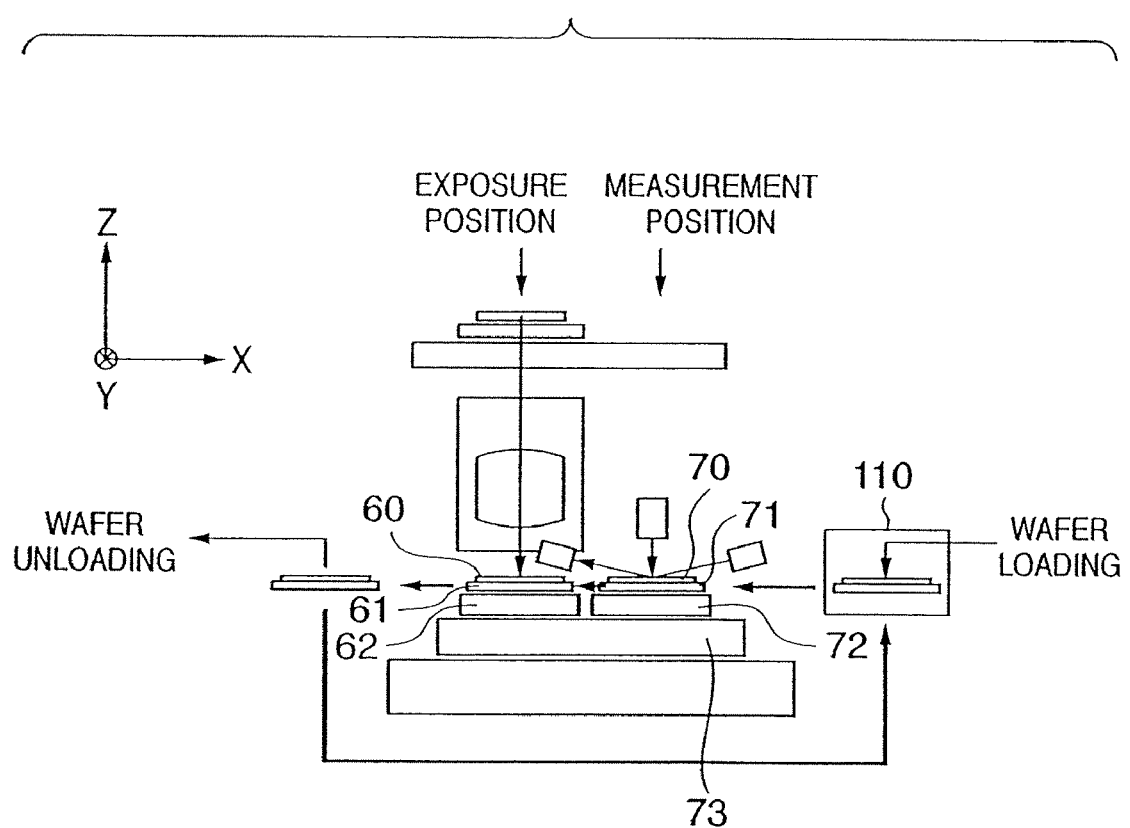
FIG. 1 is a view showing a schematic arrangement of the present invention.

FIG. 1 shows the arrangement of an exposure apparatus according to the present invention.

In FIG. 1, reference numeral 60 denotes an exposure wafer; 61, an exposure chuck; 62, an exposure fine adjustment stage; 70, a measurement wafer; 71, a measurement chuck (wafer chuck); 72, a measurement fine adjustment stage; 73, a coarse adjustment stage which bears the exposure fine adjustment stage 62 and measurement fine adjustment stage 72 and can move horizontally; and 110, a coarse alignment unit arranged outside the coarse adjustment stage 73.

In the semiconductor exposure apparatus according to the present invention, the two fine adjustment stages 62 and 72 are mounted on the one coarse adjustment stage 73. The semiconductor exposure apparatus is arranged to simultaneously perform exposure and focus measurements at exposure and measurement positions by operation of the one coarse adjustment stage 73. When an alignment shot of the measurement wafer 70 comes to near the measurement point during exposure of the exposure wafer 60, the exposure is temporarily interrupted to perform alignment measurement.

A wafer having undergone alignment and focus measurements at the measurement position on the measurement fine adjustment stage 72 is sequentially transferred to the exposure position on the exposure fine adjustment stage 62 together with the measurement chuck 71, as indicated by an arrow. Exposure operation of this wafer is performed in parallel with measurement operation of the next wafer. This makes it possible to simultaneously perform exposure and measurement by operation of the one coarse adjustment stage and to implement a compact high-speed exposure apparatus.

To increase the precision of focus measurement and the speed of alignment measurement, patterns on respective wafers at the exposure and measurement positions preferably always have a predetermined positional relationship. For this reason, each pattern on the corresponding wafer is aligned with respect to a chuck in the coarse alignment unit 110 before loading onto the fine adjustment stages.

The conventional arrangement described in "(A) Place Two Coarse Adjustment Stages on Same Surface Plate" drives two large coarse adjustment stages. In contrast to this, the semiconductor exposure apparatus according to the present invention uses two movable units of respective small fine adjustment stages while the units are almost fixed, thus preventing stage interference. In other words, the semiconductor exposure apparatus adopts a method of aligning in advance the patterns on the wafers on the two fine adjustment stages with each other to implement parallel exposure and measurement operations on the fine adjustment stages whose driving strokes are short.

The present invention incorporates various structural implementations, in addition to the above-mentioned ones. These implementations will be described specifically in the following embodiment.

DESCRIPTION OF DETAILED EMBODIMENT

A semiconductor exposure apparatus according to an embodiment of the present invention is a scan-type one which uses an $F_2$ excimer laser as a light source. Since $F_2$ excimer laser beams are absorbed by oxygen in the air and attenuate, a space through which exposure light passes needs to be purged with nitrogen. The semiconductor exposure apparatus of this embodiment is arranged to purge with nitrogen a space through which all exposure light beams pass, including the periphery of a stage. The present invention, however, is not limited to a semiconductor exposure apparatus which uses an $F_2$ excimer laser as a light source and can also be applied to EUV and EB exposure apparatuses.

[Outline of Semiconductor Exposure Apparatus (FIG. 3)]

Figure 3:
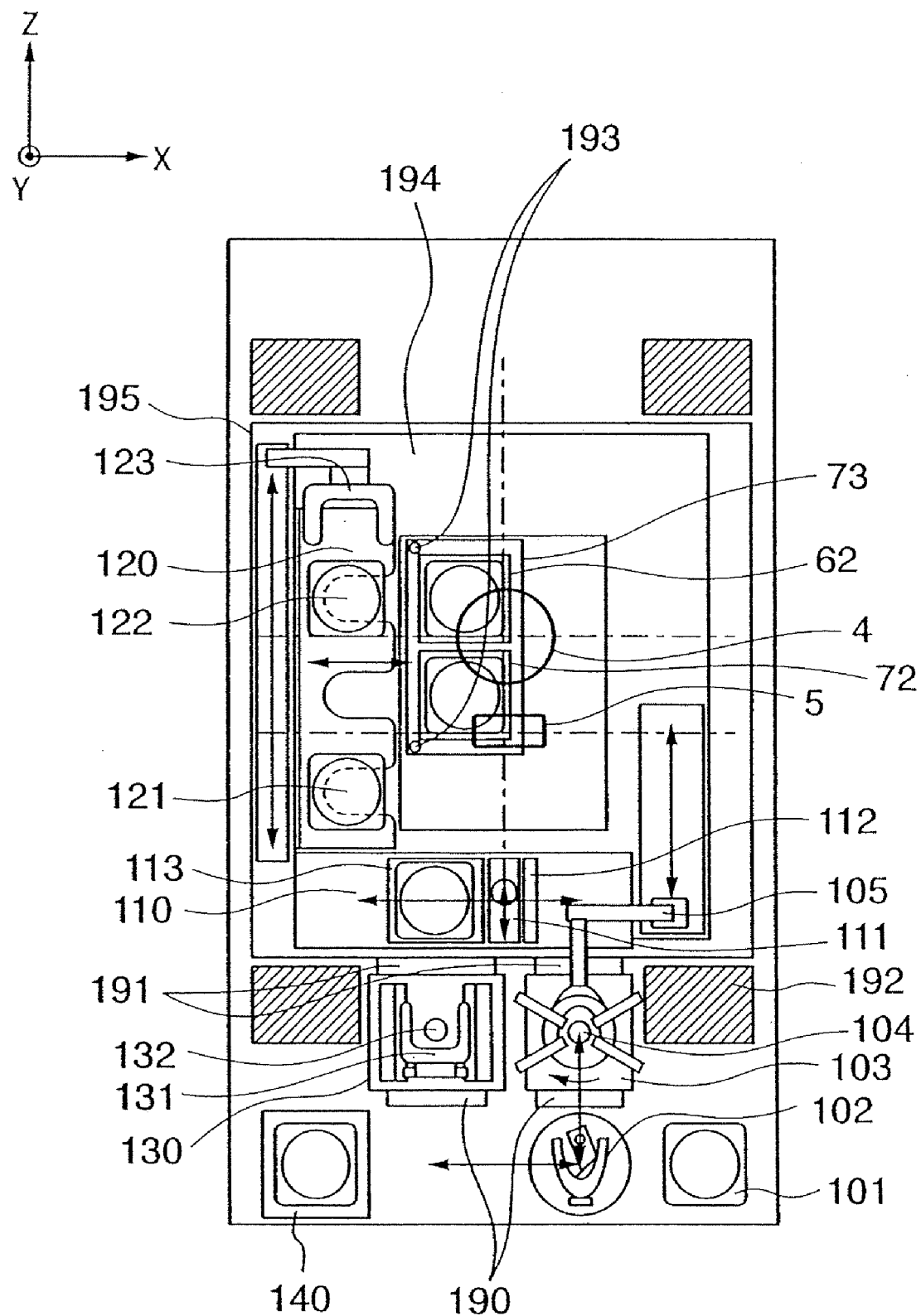
FIG. 3 is a plan view showing the schematic arrangement of a semiconductor exposure apparatus according to an embodiment of the present invention.

FIG. 3 is a plan view showing the outline of the semiconductor exposure apparatus according to the embodiment of the present invention.

The semiconductor exposure apparatus of this embodiment comprises components along the transport path of a wafer. In FIG. 3, reference numeral 101 denotes a loading position of the wafer; 102, a wafer hand which transports the wafer; 103, a loading load lock chamber; 104, a prealignment unit; 105, a loading hand; 110, the coarse alignment unit; 111, a coarse alignment scope of the coarse alignment unit 110; 112, a coarse focus sensor unit of the coarse alignment unit 110; 113, a coarse chuck stage of the coarse alignment unit 110; 120, a loading plate; 121, a chuck loading position on the loading plate 120; 122, a chuck unloading position on the loading plate 120; 123, a chuck hand which transports a chuck; 130, an unloading load-lock chamber; 131, an unloading hand capable of transporting the wafer or chuck; 132, an unloading Z unit which vertically drives the wafer or chuck; 140, an open cassette; 190, outer air gate valves of the loading and unloading load-lock chambers; 191, purge gate valves of the loading and unloading load lock chambers; 192, support columns of a structure (not shown) which holds a projection system 4 and an alignment scope 5; 193, loading plate position sensors attached to the coarse adjustment stage 73 to measure the position of the loading plate 120; 194, a nitrogen purge space; and 195, nitrogen purge space partition walls.

Figure 2A:
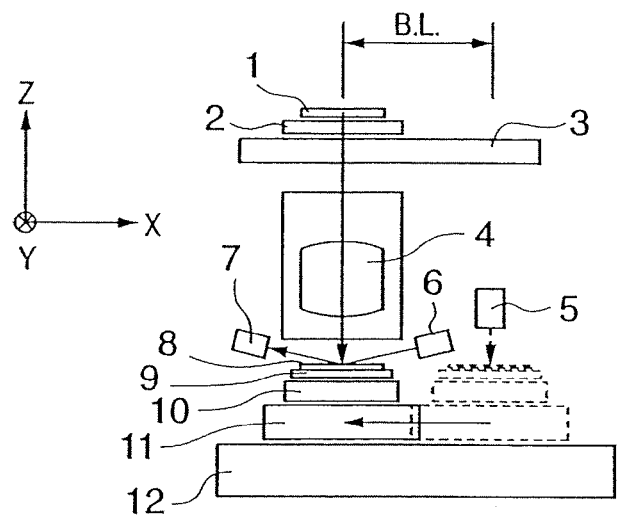
FIG. 2A is a view showing a typical arrangement of a conventional semiconductor exposure apparatus.
Figure 2B:
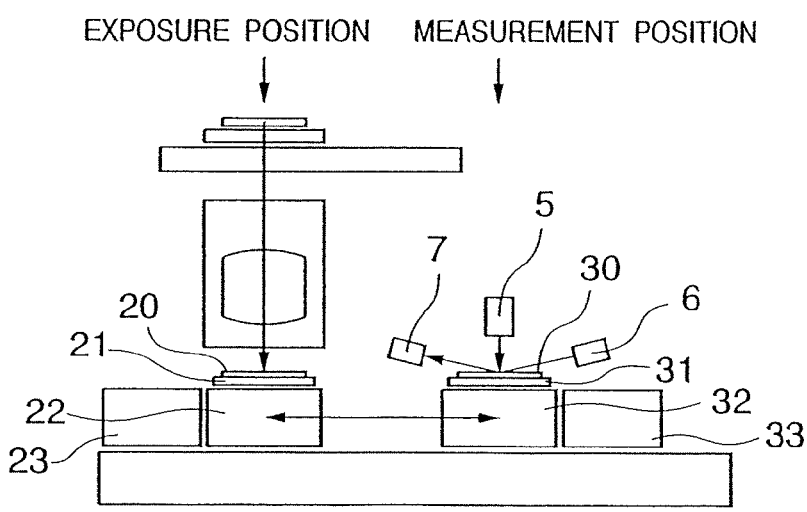
FIG. 2B is a view showing the arrangement of a conventional improved method 1.
Figure 2C:
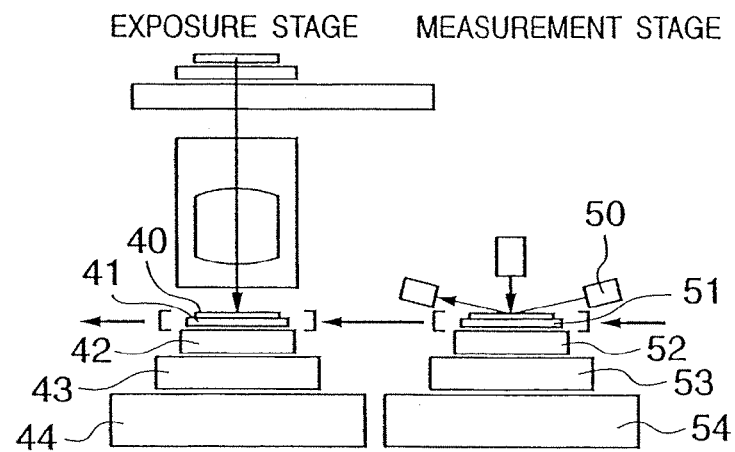
FIG. 2C is a view showing the arrangement of a conventional improved method 2.

Reference numeral 4 denotes the projection system; 5, the alignment scope; 62, the exposure fine adjustment stage; 72, the measurement fine adjustment stage; and 73, the coarse adjustment stage, as described with reference to FIGS. 1 and 2A.

(Outline of Operation)

In the semiconductor exposure apparatus of this embodiment, a wafer is first loaded to the loading position 101. A temperature-adjusting unit (not shown) is provided below the loading position 101 to adjust the temperature of the loaded wafer so as to fall within a predetermined range. When the temperature of the wafer falls within the predetermined range, the wafer hand 102 moves the wafer to the prealignment unit 104 in the loading load-lock chamber 103. The prealignment unit 104 measures the outer shape of the wafer and aligns the wafer such that a notch formed in the wafer faces in a predetermined rotational direction. The prealignment operation and purge of the loading load-lock chamber 103 with nitrogen are simultaneously performed, thereby preventing any loss in time.

When the prealignment by the prealignment unit 104 is completed, the loading hand 105 moves the wafer from the prealignment unit 104 onto a chuck on standby in the coarse alignment unit 110. The coarse alignment unit 110 roughly measures the position of a pattern of the wafer on the chuck and the height of the entire wafer and performs alignment such that chuck reference marks on the edges of the chuck and a predetermined pattern of the wafer have a predetermined relative positional relationship. After that, the wafer is moved to the chuck loading position 121 on the loading plate 120, while being chucked by the chuck hand 123. Movement of the loading plate 120 to the side of the coarse adjustment stage 73 causes the chuck at the chuck loading position 121 to move onto the measurement fine adjustment stage 72 on standby. At this position, the measurement fine adjustment stage 72 moves upward and receives the chuck from the loading plate 120.

Then, the loading plate 120 retreats to the original position shown in FIG. 3. The wafer on the measurement fine adjustment stage 72 undergoes focus and alignment measurements (to be described later) and moves onto the exposure fine adjustment stage 62 through the loading plate 120 to perform exposure. Upon completion of the exposure, the chuck moves to the chuck unloading position 122 through the loading plate 120.

The chuck is returned to the coarse alignment unit 110 by the chuck hand 123, and only the wafer is pulled out by the unloading hand 131 in the unloading load-lock chamber 130. After the unloading load-lock chamber 130 is purged with dry air, the wafer hand 102 returns the wafer to the loading position 101 and issues an unloading command to an external processing apparatus.

[Outline of Arrangement and Operation of Wafer Stage (FIGS. 4A and 4B)]

The arrangement and operation of a wafer stage will be described in detail.

Figure 4A:
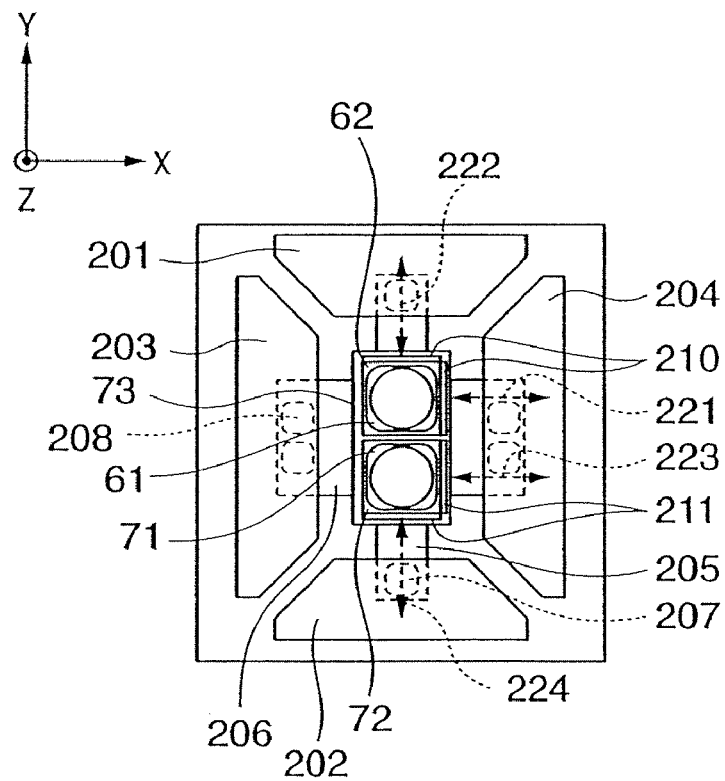
FIGS. 4A and 4B are plan and front views, respectively, of a coarse adjustment type.
Figure 4B:
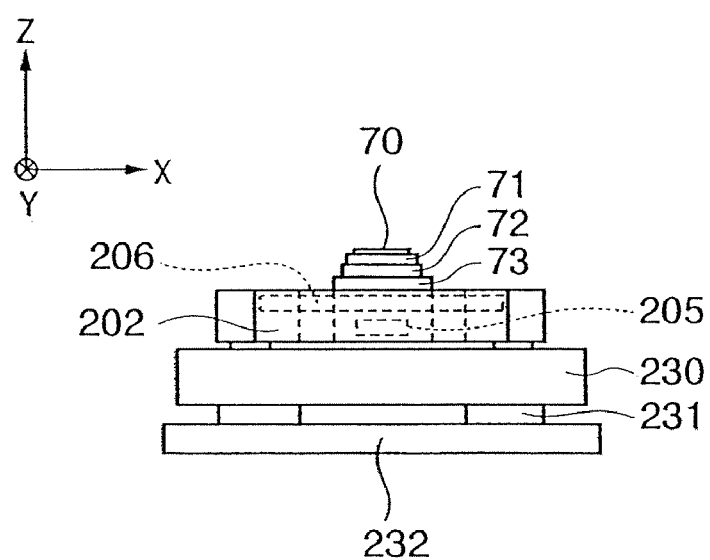

FIGS. 4A and 4B are plan and front views, respectively, of the coarse adjustment stage according to the embodiment of the present invention.

In FIGS. 4A and 4B, reference numeral 73 denotes the coarse adjustment stage; 61, the exposure chuck; 62, the exposure fine adjustment stage; 71, the measurement chuck; 72, the measurement fine adjustment stage; 201, an upper X counter mass; 202, a lower X counter mass; 203, a left Y counter mass; 204, a right Y counter mass; 205, an X driving beam; 206, a Y driving beam; 207, X linear motor magnets; 208, Y linear motor magnets; 210, laser interferometer exposure bar mirrors; 211, laser interferometer measurement bar mirrors; 221, an exposure laser interferometer beam X; 222, an exposure laser interferometer beam Y; 223, a measurement laser interferometer beam X; 224, a measurement laser interferometer beam Y; 230, a wafer stage surface plate; 231, wafer stage dampers; and 232, a wafer stage base plate.

(Outline of Operation)

In the semiconductor exposure apparatus of this embodiment, the wafer stage surface plate 230 is levitated by a jet of nitrogen with respect to the wafer stage surface plate 230. The semiconductor exposure apparatus is capable of moving the coarse adjustment stage 73 in the Y direction through the Y driving beam 206 by driving the Y linear motor magnets 208 with Y linear motor coils (not shown) and in the X direction through the X driving beam 205 by driving the X linear motor magnets 207 with X linear motor coils (not shown).

The two fine adjustment stages, i.e., the exposure fine adjustment stage 62 and measurement fine adjustment stage 72 are mounted on the coarse adjustment stage 73. Use of laser interferometers allows X and Y position measurements and fine driving of each fine adjustment stage. A fine adjustment stage movable unit (not shown) in each fine adjustment stage can perform fine driving in the height (Z axis) and tilt directions by an internal linear motor. The coarse adjustment stage 73 has four counter masses, i.e., the upper X counter mass 201, lower X counter mass 202, left Y counter mass 203, and right Y counter mass 204 mounted in a linear motor unit (not shown) to cancel any reaction force generated upon driving. Driving these counter masses in a direction opposite to that of the coarse adjustment stage 73 being driven cancels any reaction force generated by the coarse adjustment stage 73.

The coarse adjustment stage 73 is arranged on the wafer stage surface plate 230, which is placed on the floor through the wafer stage dampers 232 for cutting off floor vibrations.

The above-mentioned stages have the following features.

(1) Driving Stroke of Each Fine Adjustment Stage

The driving stroke of the measurement fine adjustment stage 72 is set to be larger than that of the exposure fine adjustment stage 62. This is because the measurement fine adjustment stage 72 receives a wafer chuck from outside the stage and needs driving to correct a relatively large error generated upon loading. The exposure fine adjustment stage 62 must maintain synchronization between a reticle and wafer at high precision in exposure, and has a short driving stroke to achieve a quick response.

(2) Mechanical Resonance Frequency

The mechanical resonance frequencies of the measurement fine adjustment stage 72 and exposure fine adjustment stage 62 are set to differ from each other. This is to prevent any mutual interference in alignment of each fine adjustment stage.

(3) Dynamic Control of Control Parameters

In exposure operation, the control gain (parameter) of the exposure fine adjustment stage 62 is set to be high while that of the measurement fine adjustment stage 72 is set to be low. In alignment measurement to be performed during the exposure operation, the control gain of the exposure fine adjustment stage 62 is set to be low while that of the measurement fine adjustment stage 72 is set to be high. This is because the exposure fine adjustment stage 62 requires high-precision synchronous control of the wafer and reticle in the exposure operation while the measurement fine adjustment stage 72 requires the accurate position information of the wafer in the alignment measurement.

In the above-mentioned setting, the control gain of one fine adjustment stage is set to be high while that of the other is set to be low. This is intended to prevent unnecessary vibrations from being transmitted from the measurement fine adjustment stage 72 to the exposure fine adjustment stage 62 in exposure or from the exposure fine adjustment stage 62 to the measurement fine adjustment stage 72 in measurement.

(4) Calibration of Bar Mirror for Each Fine Adjustment Stage

Each of the exposure fine adjustment stage 62 and measurement fine adjustment stage 72 is arranged to control its movable portion at the upper portion to be locked with respect to its fixed portion at the lower portion. In this locked state, the coarse adjustment stage 73 is driven in the X and Y directions, and laser interferometers measure the position of each fine adjustment stage. This makes it possible to measure the relative error at each position in the X direction between the X-measurement bar mirrors of the fine adjustment stages and the relative error at each position in the Y direction between the Y-measurement bar mirrors of the fine adjustment stages. The relative errors between the bar mirrors are used to cause the stage coordinates of the measurement unit and those of the exposure unit to precisely coincide with each other.

(5) Constraints on Chuck Mounting

The coarse adjustment stage 73 is driven only when both the fine adjustment stages bear or do not bear respective chucks. This is because the weight balance of the coarse adjustment stage 73 needs to be kept constant to drive the coarse adjustment stage 73 at high speed and high precision.

(6) Loading Plate Tracking Function

The loading plate 120 is fixed on the wafer stage base plate 232, and the coarse adjustment stage 73 is placed on the wafer stage surface plate 230 on the wafer stage dampers. For this reason, the loading plate 120 and each fine adjustment stage needs to have a predetermined positional relationship in transferring a chuck between them. To implement this, the loading plate position sensors 193 are arranged on the coarse adjustment stage 73. In chuck transfer, each fine adjustment stage is finely driven such that the loading plate 120 and the movable unit at the upper portion of the fine adjustment stage have a predetermined positional relationship.

[Outline of Arrangement and Operation of Prealignment (FIGS. 5A and 5B)]

Figure 5A:
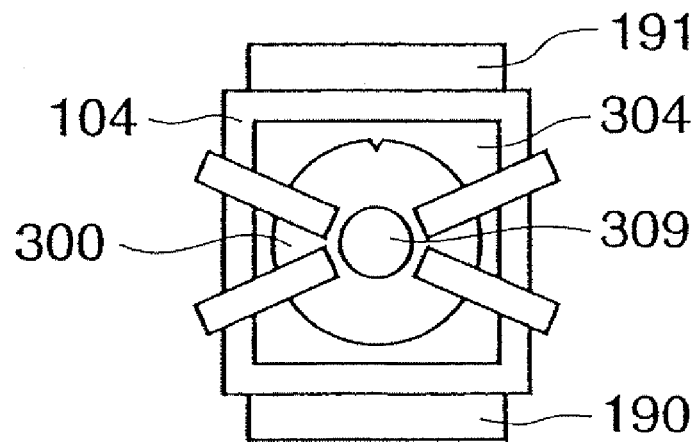
FIGS. 5A and 5B are plan and front views, respectively, of a prealignment unit.
Figure 5B:
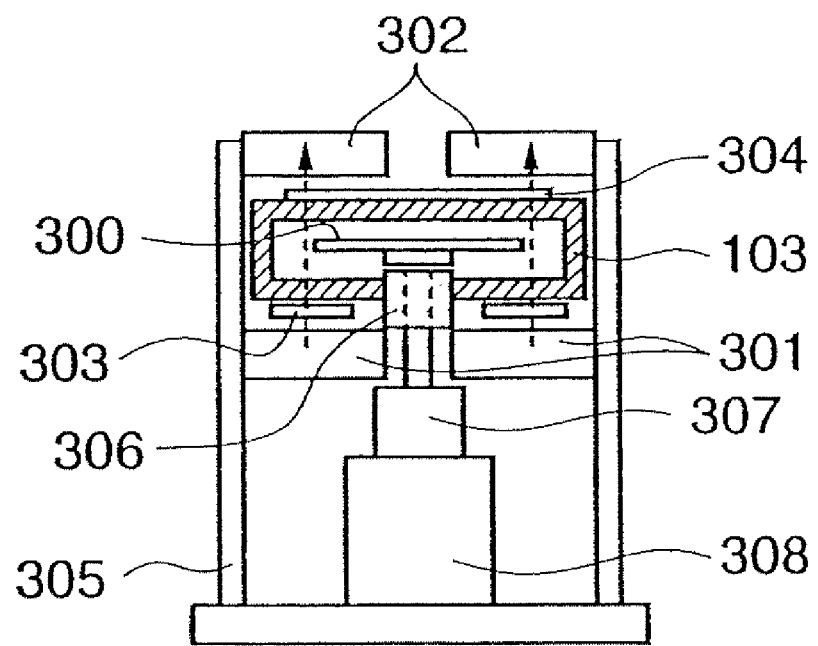

FIGS. 5A and 5B are plan and front views, respectively, of the prealignment unit of the semiconductor exposure apparatus according to the embodiment of the present invention.

As shown in FIGS. 5A and 5B, reference numeral 103 denotes the loading load-lock chamber; 190, the outer air gate valves; 191, the purge gate valves; 300, a wafer during prealignment; 301, a prealignment light-projecting unit; 302, prealignment sensors; 303, a sheet glass (on the light-projecting unit side); 304, a sheet glass (on the sensor side); 305, a sensor support unit; 306, a purge seal unit; 307, a rotation mechanism unit; 308, a Z driving unit; and 309, a wafer support unit.

(Outline of Operation)

After the loading load-lock chamber 103 is purged with dry air, the outer air gate valves 190 are opened, and the wafer 300 is loaded to the wafer support unit 309 by the wafer hand 102. At this time, the prealignment light-projecting unit 301 and prealignment sensors 302 measure the circumferential edge position of the wafer 300 being loaded. The wafer 300 is aligned by stretching and contracting operation and rotation operation of the wafer hand 102 such that the center of the wafer 300 almost coincides with that of the wafer support unit 309. The wafer 300 is placed on the wafer support unit 309.

The rotation mechanism unit 307 on the outer air side rotates the wafer 300 through the purge seal unit 306, and the prealignment sensors 302 measure the circumferential edge position of the wafer during the rotation. This measurement enables more precise measurement of the wafer edge position and the notch (or orientation flat) position. Hence, the rotation mechanism unit 307 rotates the wafer such that the notch faces in a predetermined direction.

In the prealignment unit 104, the volume of the loading load-lock chamber 103 needs to be minimized to minimize the nitrogen purge time. To implement this, the prealignment light-projecting unit 301 and prealignment sensors 302 are arranged outside the loading load-lock chamber 103 to receive detection light into the loading load-lock chamber 103 through the sheet glass 303 (on the light-projecting unit side) and sheet glass 304 (on the sensor side).

Outer shape errors in the X and Y directions after the notch is rotated in a predetermined direction will be described later in [Outline of Coarse Alignment].

[Outline of Arrangement and Operation of Coarse Alignment Unit (FIGS. 6A to 6D)]

The coarse alignment unit performs three major operations as follows.

(1) The coarse alignment unit performs alignment such that a reference mark on the chuck and a prealignment mark on the wafer have a predetermined relative positional relationship. The coarse alignment unit stores shifts in the X, Y, and θ directions from the target relative position in this alignment.

(2) The coarse alignment unit aligns the θ direction of the reference mark on the chuck with the reference position of the coarse alignment unit. The coarse alignment unit stores shifts in the X and Y directions from the target position.

(3) The coarse alignment unit measures the height of the upper surface of the reference mark on the chuck and that of the upper surface of the wafer and stores the measurement results.

The above-mentioned functions are very important for the semiconductor exposure apparatus according to the present invention. This is because measurements to be described later, i.e., simultaneous measurement of reference marks on the exposure and measurement chucks, focus measurement to be performed in parallel with exposure operation on the exposure side, and alignment measurement on the measurement side to be performed while the exposure operation on the exposure side is temporarily interrupted are based on the premise that patterns on the wafers on the exposure and measurement sides have a predetermined positional relationship at relatively high precision. The coarse alignment unit described herein performs measurements required to implement this.

The arrangement of the coarse alignment unit will be described below.

FIGS. 6A to 6D are a plan view, a front view in wafer loading, a front view upon completion of coarse alignment, and a front view in wafer unloading, respectively, of the coarse alignment unit 110 of the semiconductor exposure apparatus according to the embodiment of the present invention.

As shown in FIGS. 6A to 6D, reference numeral 110 denotes the entire coarse alignment unit; 111, the coarse alignment scope; 112, the coarse focus sensor unit; 113, the coarse chuck stage which can move in the X direction; 401, an objective lens for measuring a chuck reference mark of the coarse alignment scope 111; 402, an objective lens for detecting a wafer prealignment mark of the coarse alignment scope 111; 403, (five) fiber sensors of the coarse focus sensor unit 112 to measure the height of the upper surface of a chuck reference plate (to be described later) and the upper surface of a wafer; 405, a chuck during coarse alignment; 406, a wafer during coarse alignment; 407, a chuck support unit which holds the chuck 405 from below and can perform fine vertical and rotation driving; and 408, three wafer support pins which can finely drive in the X, Y, and θ directions and can operate in the Z direction.

The coarse alignment unit 110, loading hand 105, chuck hand 123, and loading plate 120 are fixed on the wafer stage base plate 232 so as to prevent vibrations generated upon coarse alignment operation (to be described later) and the like from being directly transmitted to, e.g., the coarse adjustment stage 73 on the wafer stage surface plate 230.

(Outline of Operation)

In FIGS. 6A to 6D, the five fiber sensors 403 are arranged in the coarse focus sensor unit 112 almost equidistantly. The two outermost fiber sensors (top and bottom ones in FIG. 6A) are used to measure the height of the upper surface of the chuck reference plate (to be described later) on the chuck 405 while the three inner fiber sensors are used to measure the height of the upper surface of the wafer 406 on the chuck 405. When the wafer 406 passes below the coarse focus sensor unit 112, the heights of the upper surfaces of the chuck reference plate and wafer are measured. Resultant measurement values are used to perform correction driving in the Z and tilt directions after the chuck 405 is mounted on the measurement fine adjustment stage 72 on the coarse adjustment stage 73 and align the upper surface of the wafer within a range which allows focus measurement in final focus measurement on the coarse adjustment stage.

The objective lens (for chuck reference marks) 401 of the coarse alignment scope 111 in FIGS. 6A to 6D is fixed to the coarse alignment scope 111 and is used to measure two chuck reference marks (to be described later) at the upper left and right positions on the chuck reference plate on the chuck.

The objective lens (for wafer marks) 402 of the coarse alignment scope 111 can drive in the Y direction, as indicated by an arrow. The objective lens 402 moves to a position in the Y direction where a prealignment mark (not shown) on the wafer 406 having been specified by the operator of the apparatus can be observed. The objective lens 402 is used to measure the position of the prealignment mark. Prealignment marks are generally located at two points on a wafer. The wafer 406 temporarily stops four times below the coarse alignment scope 111 to measure the positions of the prealignment marks (twice) and chuck reference marks (twice).

The coarse chuck stage 113 has the three wafer support pins 408, which can finely drive in the X, Y, and θ directions and can also drive vertically, as indicated by inner arrows. Assume that measurement results of the chuck reference marks and prealignment marks show that the prealignment marks on the wafer are not located at predetermined positions relative to the reference marks on the chuck and are separated from the reference marks by distances of more than a tolerance. In this case, the three wafer support pins 408 lift the wafer 406 from the chuck 405, perform for the wafer 406 fine correction driving in the X, Y, and θ directions so as to attain a predetermined positional relationship, and return the wafer 406 onto the chuck 405. With this operation, the prealignment marks on the wafer have a predetermined relative positional relationship with the chuck reference marks on the chuck.

An error in the θ direction of each chuck reference mark is obtained from measurement results of the two chuck reference marks. Such an error is eliminated by finely rotating the coarse chuck stage 113.

After the above-mentioned operation, similar operation is repeated such that the prealignment marks on the wafer are located at predetermined positions relative to the chuck reference marks on the chuck, and an error in the θ direction of each chuck reference mark is eliminated.

Residual errors after the above mentioned operation, i.e., the following two errors (1) and (2) will be described later in [Outline of Coarse Alignment]:

(1) residual error amounts in the X, Y, and θ directions of the prealignment marks with respect to the chuck reference marks; and (2) residual error amounts in the X, Y, and θ directions of the chuck reference marks with respect to the coarse alignment unit.

Figure 6A:
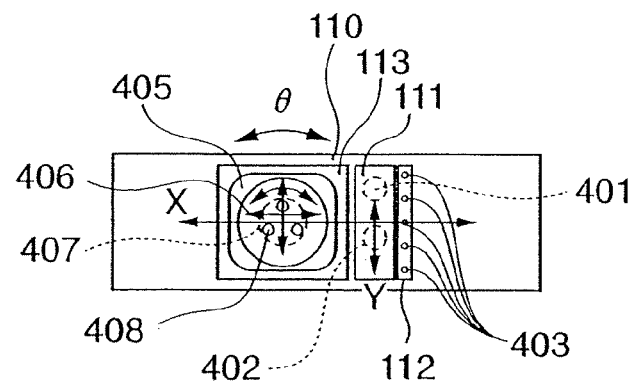
FIGS. 6A to 6D are a plan view, a front view in wafer loading, a front view upon completion of coarse alignment, and a front view in wafer unloading, respectively, of the coarse alignment unit.
Figure 6B:
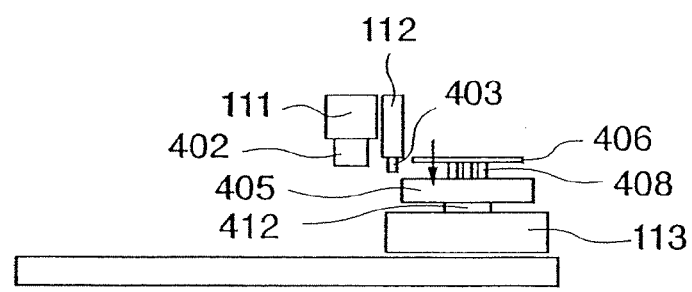

FIG. 6B shows wafer loading. The three wafer support pins 408 extend upward from the coarse chuck stage 113 through the chuck 405. The wafer is placed on the three wafer support pins by the loading hand 105. The three wafer support pins 408 retract into the coarse chuck stage 113 and pass the wafer 406 to the chuck 405. Then, the coarse chuck stage 113 starts moving to the left. When the wafer 406 comes to below the coarse focus sensor unit 112, the fiber sensors 403 start measuring the heights of the upper surfaces of the chuck reference plate and wafer.

During the measurement, the chuck reference marks on the chuck reference plate and prealignment marks on the wafer 406 come to below the coarse alignment scope 111. Then, the coarse alignment scope 111 captures the image information of their patterns and measures the positions of the chuck reference marks and prealignment marks on the wafer.

At this time, the height of the chuck reference plate and those of the prealignment marks on the wafer are already obtained by the fiber sensors 403. The detection surface is always kept at the measurement image plane position of the coarse alignment scope 111 by driving the chuck 405 in the Z direction with the coarse chuck stage 113.

Correction driving to follow is as described above. The chuck will be described later in detail. A chuck used in the semiconductor exposure apparatus of this embodiment needs to be vacuum chucked and fixed to the coarse chuck stage 113, measurement fine adjustment stage 72, exposure fine adjustment stage 62, chuck hand 123, or loading plate 120. The lower surface of the chuck has a planar structure. For this reason, while the chuck moves among a plurality of positions, it may shift from a predetermined position in each unit of the apparatus due to a long-term accumulation of transport errors.

To prevent this shift, the semiconductor exposure apparatus of this embodiment detects positional shifts in the X, Y, and θ directions of the chuck using measurement results of the two stage reference mark positions. The semiconductor exposure apparatus eliminates a shift in the X direction by shifting the X position of the coarse chuck stage 113 in moving the chuck to the chuck hand 123, a shift in the Y direction by shifting the Y position of the chuck hand 123 in moving the chuck to the chuck hand 123, and a shift in the θ direction by rotating a chuck support unit 412.

The overall description will be given in [Outline of Coarse Alignment].

Figure 6C:
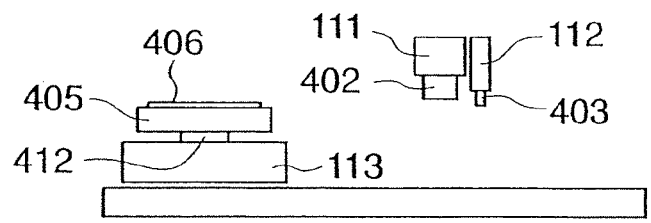
Figure 6D:
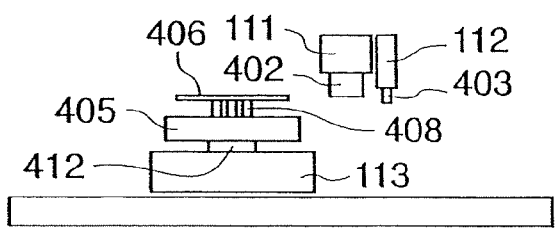

FIG. 6C shows how the chuck is moved from the coarse alignment unit 110 to the chuck hand 123 after the operation in the coarse alignment unit 110. FIG. 6D shows how the exposed wafer is unloaded.

As shown in FIGS. 6C and 6D, the coarse chuck stage 113 lifts the wafer 406 by the three wafer support pins 408 such that the unloading hand 131 can pick up the wafer 406 on the chuck 405, similarly to wafer loading. Though not shown in FIGS. 6C and 6D, in unloading the chuck 405, the unloading hand 131 is arranged to insert its hand unit into the chuck support unit 412 below the chuck 405 and unload the chuck 405 from the coarse chuck stage 113.

[Outline of Structure of Chuck Pipe Line (FIGS. 7A to 7C and 8A and 8B)]

The structure of a chuck pipe line used in the semiconductor exposure apparatus of this embodiment will be described below.

The semiconductor exposure apparatus of this embodiment adopts a method of transporting a wafer together with a chuck. To maintain the position of the wafer during chuck transport, a unique pipe mechanism is employed inside the chuck.

Figure 7A:
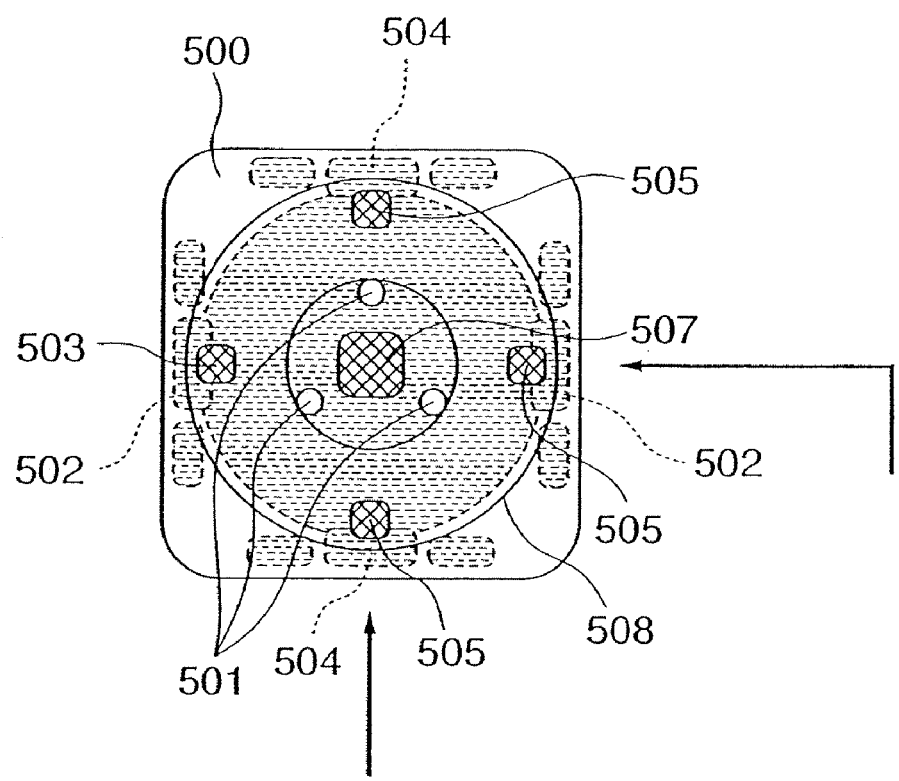
FIGS. 7A to 7C are plan, front, and side views, respectively, showing the structure of a chuck pipe line.
Figure 7B:
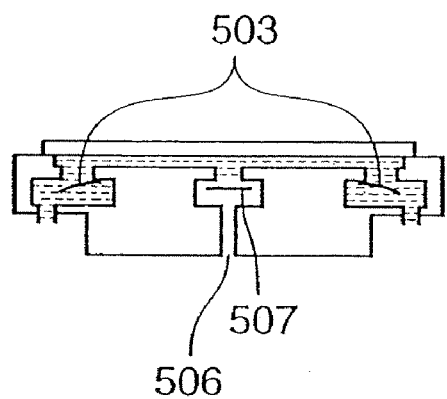
Figure 7C:
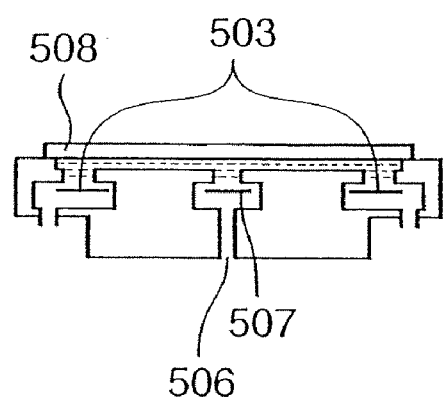
Figure 8A:
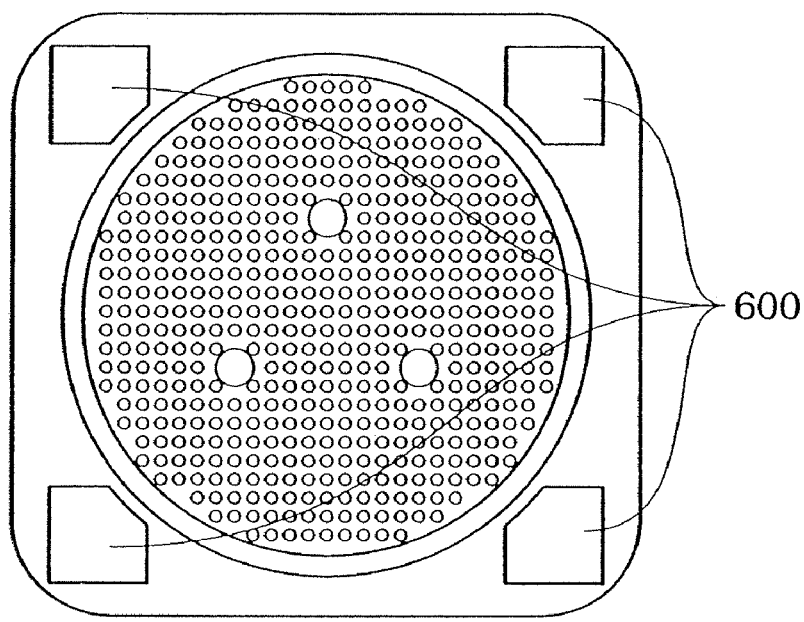
FIG. 8A is an enlarged view of the upper surface of a chuck.
Figure 8B:
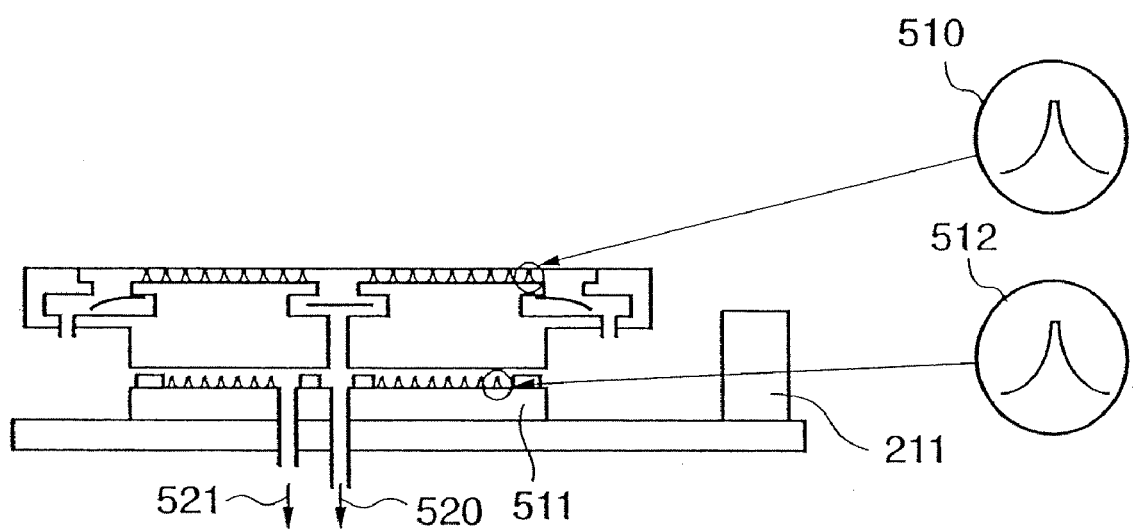
FIG. 8B is a sectional view including a chuck support unit on a fine adjustment stage.

FIGS. 7A to 7C are plan, front, and side views, respectively, showing the structure of the chuck pipe line. FIGS. 8A and 8B are an enlarged view of the upper surface of a chuck and a sectional view including a chuck support unit on a fine adjustment stage.

As shown in FIGS. 7A to 7C, reference numeral 500 denotes a chuck; 501, holes through which the three wafer support pins 408 of the coarse chuck stage 113 pass in the coarse alignment unit 110; 502, wafer vacuum (Vac.) portions to which wafer Vac. pipes from the chuck hand 123 are connected; 503, wafer Vac. valves at the inlets of the wafer Vac. portions 502; 504, wafer Vac. portions to which wafer Vac. pipes from the loading plate 120 are connected; 505, wafer Vac. valves at the inlets of the wafer Vac. portions 504; 506, a wafer Vac. portion to which a wafer Vac. pipe from the exposure fine adjustment stage 62 or measurement fine adjustment stage 72 is connected; 507, a wafer Vac. valve at the inlet of the wafer Vac. portion 506; and 508, a wafer chucked and held on the chuck 500 by a Vac. (negative pressure).

In FIG. 8A, chuck reference plates 600 are arranged at the four corners of the chuck. Their upper surfaces are used as references of height at the exposure and measurement positions. Chuck reference marks (to be described later) are formed in the chuck reference plates 600.

In FIG. 8B, reference numeral 510 denotes chuck pins arranged within a region immediately below the wafer 508 and on the upper surface of the chuck; 511, a fine adjustment top plate attached to the upper surface of the fine adjustment stage movable unit at the upper portion of each of the two fine adjustment stages; 512, top plate pins arranged within a region immediately below the chuck 500 and on the upper surface of the fine adjustment top plate 511; 520, a fine adjustment wafer Vac. for chucking the wafer on the chuck by a Vac.; and 521, a fine adjustment chuck Vac. for fixing the chuck 500 on the fine adjustment top plate 511.

(Outline of Operation)

The chuck needs to move on the coarse chuck stage 113, chuck hand 123, loading plate 120, measurement fine adjustment stage 72, and exposure fine adjustment stage 62 while holding the wafer. For this reason, a wafer chucking Vac. can be supplied from the above-mentioned units. When the chuck is to be moved between two of the units, it must receive Vac. simultaneously from the two units. The chuck of this embodiment has a plurality of Vac. inlets and corresponding Vac. valves inside the Vac. inlets to smoothly switch between Vac. supply lines in this case. These valves allow switching between the Vac. supply lines without a special switching mechanism.

The fine adjustment top plate 511 which fixes the chuck by chucking with a Vac. has the top plate pins 512 on its upper surface, similarly to the chuck. This is intended to minimize the effect of any dust or the like attached to the lower surface of the chuck.

[Outline of Arrangement and Operation of Chuck Switching Mechanism (FIGS. 9A to 9C and 10A to 10C)]

FIGS. 9A to 9C and 10A to 10C show an example of a chuck transport method according to the embodiment of the present invention. FIGS. 9A to 9C and 10A to 10C illustrate how the chuck 500 is mounted from the chuck hand 123 through the loading plate 120 onto the fine adjustment top plate 511 on each fine adjustment stage.

Figure 9A:
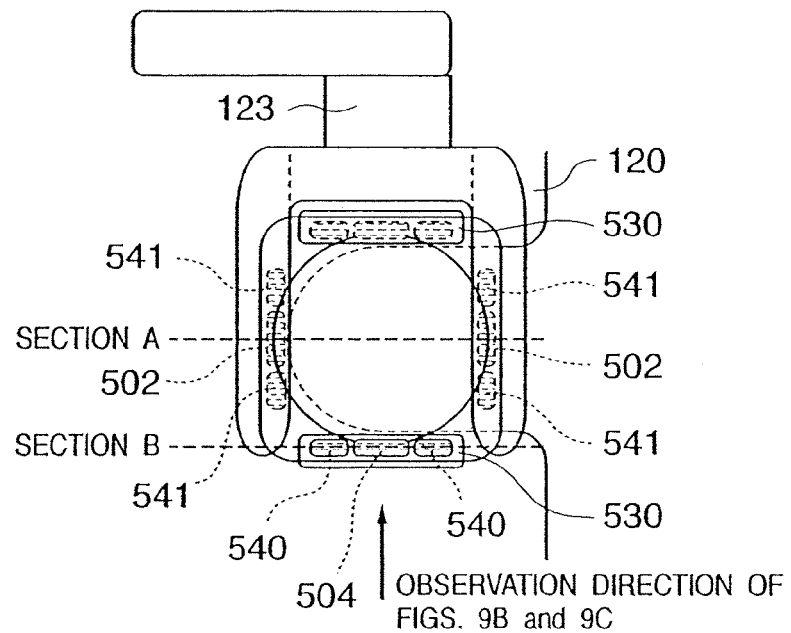
FIG. 9A is a view of a unit layout at a chuck loading position.
Figure 9B:
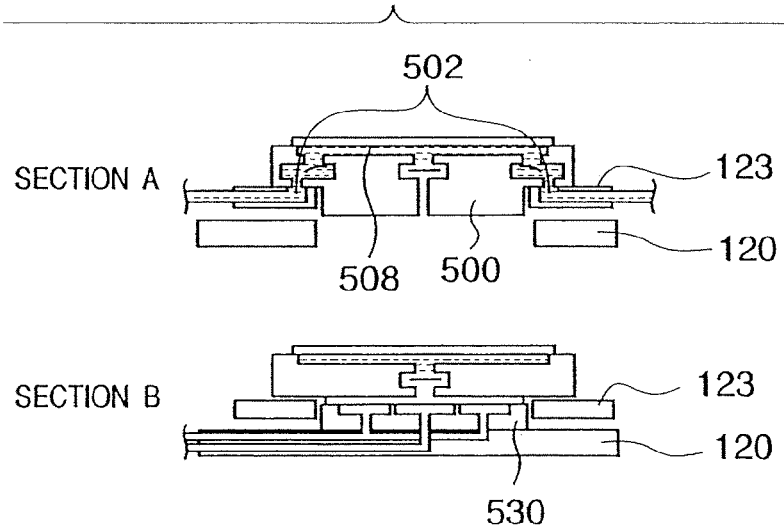
FIGS. 9B and 9C show how the chuck moves.
Figure 9C:
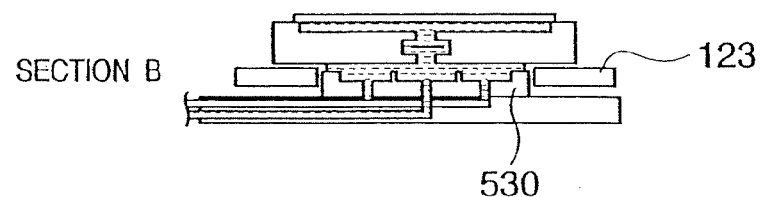
Figure 10A:
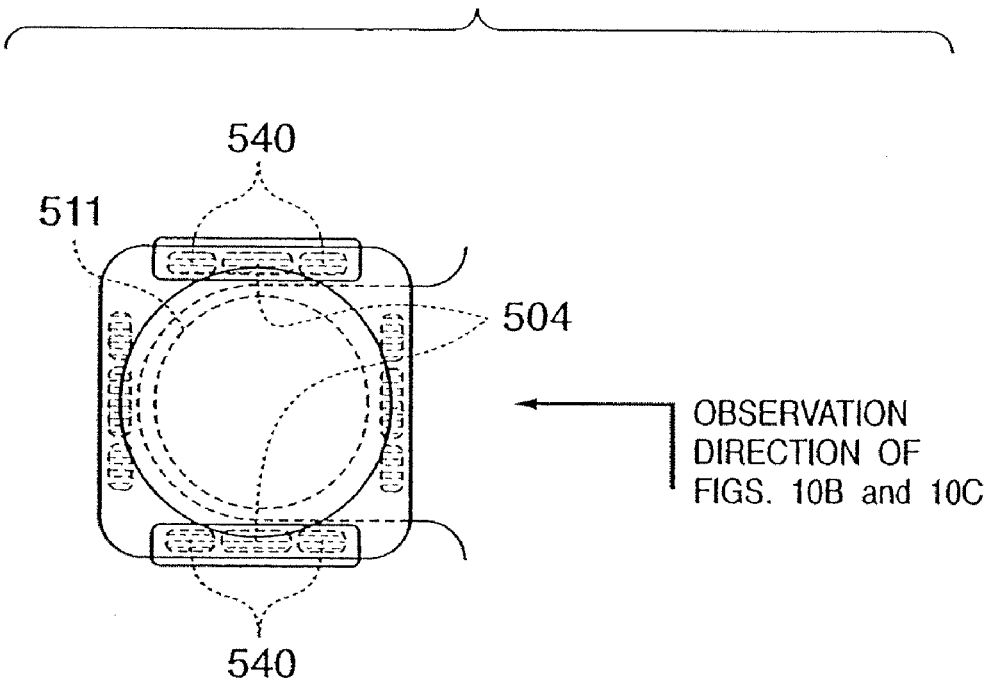
FIG. 10A is a view for explaining units at the chuck loading position.
Figure 10B:
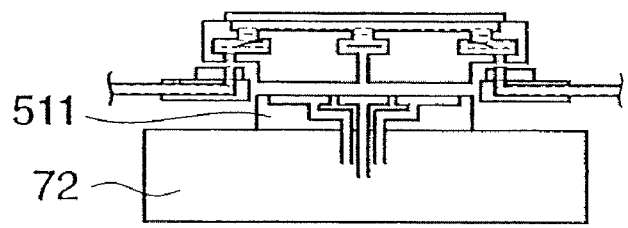
FIGS. 10B and 10C show how the chuck moves.
Figure 10C:
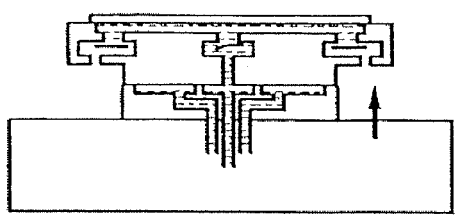

FIG. 9A is a plan view showing the chuck and 123 and loading plate 120 at the chuck loading position 121; and FIGS. 9B and 9C show how the chuck moves from the chuck hand 123 to the loading plate 120. FIG. 10A is a plan view showing the loading plate 120 and fine adjustment top plate 511 at the chuck loading position 121; and FIGS. 10B and 10C show how the chuck moves from the loading plate 120 to the fine adjustment top plate 511.

Reference numeral 530 denotes chuck support units which receive the chuck 500 from the chuck hand 123 on the loading plate 120 and hold it; 540, chuck Vac. portions which supply Vac. for chucking and holding the chuck 500 on the chuck support units 530 on the loading plate 120; and 541, chuck Vac. portions which supply Vac. for chucking and holding the chuck 500 on the chuck hand 123.

(Outline of Operation)

Operation of moving the chuck from the chuck hand 123 through the loading plate 120 onto the fine adjustment top plate 511 will be described with reference to FIGS. 9B, 9C, 10B and 10C.

(1) On Chuck Hand

A state wherein the chuck 500 is on the chuck hand 123 is shown in FIG. 9B.

In this state, the chuck 500 is mounted on the chuck hand 123. The chuck 500 is chucked on the chuck hand 123 by the chuck Vac. portions 541 with a Vac. and is fixed.

The wafer 508 is chucked on the chuck 500 by a Vac. from the wafer Vac. portions 502 and is fixed.

In this state, the chuck support units 530 on the loading plate 120 do not come into contact with the chuck 500.

(2) On Loading Plate

A state wherein the chuck 500 is on the loading plate 120 is shown in FIG. 9C.

This state is implemented by the following operation. In the state shown in FIG. 9B, the wafer Vac. portions 504 and chuck Vac. portions 540 arranged on the chuck support units 530 on the loading plate 120 are brought into a Vac. state. The chuck hand 123 is moved downward to a predetermined position, and the chuck Vac. portions 541 and the wafer Vac. portions 502 on the chuck hand 123 side are switched from the Vac. state to an atmospheric state. The chuck hand 123 is further moved downward.

A chuck holding unit of the chuck hand 123 has a vertical friction mechanism (not shown) to prevent an overload of a predetermined magnitude or more on the chuck hand 123 and chuck support units 530 in the above-mentioned operation.

(3) Above Fine Adjustment Stage

When the chuck 500 is fixed on the loading plate 120, the loading plate 120 moves from outside the coarse adjustment stage 73 onto the coarse adjustment stage 73.

In this state, the coarse adjustment stage 73 moves a movable unit at the upper portion of the measurement fine adjustment stage 72 on the coarse adjustment stage 73 downward and moves to a position where it fits into the loading plate 120. The state at this time is shown in [(3.) Above Fine Adjustment Stage].

In this state, the chuck 500 is held on the chuck support units 530 on the loading plate 120 by the chuck Vac. portions 540, as described in FIG. 10B. The wafer 508 is chucked and held with a Vac. on the chuck by the wafer Vac. portions 504 on the chuck support units 530 on the loading plate 120.

(4) On Fine Adjustment Stage Top Plate

A state wherein the chuck 500 moves onto the fine adjustment top plate 511 is shown in FIG. 10C.

This state is implemented by the following operation. In the state shown in FIG. 10B, the fine adjustment wafer Vac. 520 and fine adjustment chuck Vac. 521 on the fine adjustment top plate 511 side are brought into a Vac. state. The fine adjustment top plate 511 is moved upward to a predetermined position, and the chuck Vac. portions 540 and the wafer Vac. portions 504 on the loading plate 120 side are switched from the Vac. state to an atmospheric state. The fine adjustment top plate 511 is further moved upward.

Figure 11:
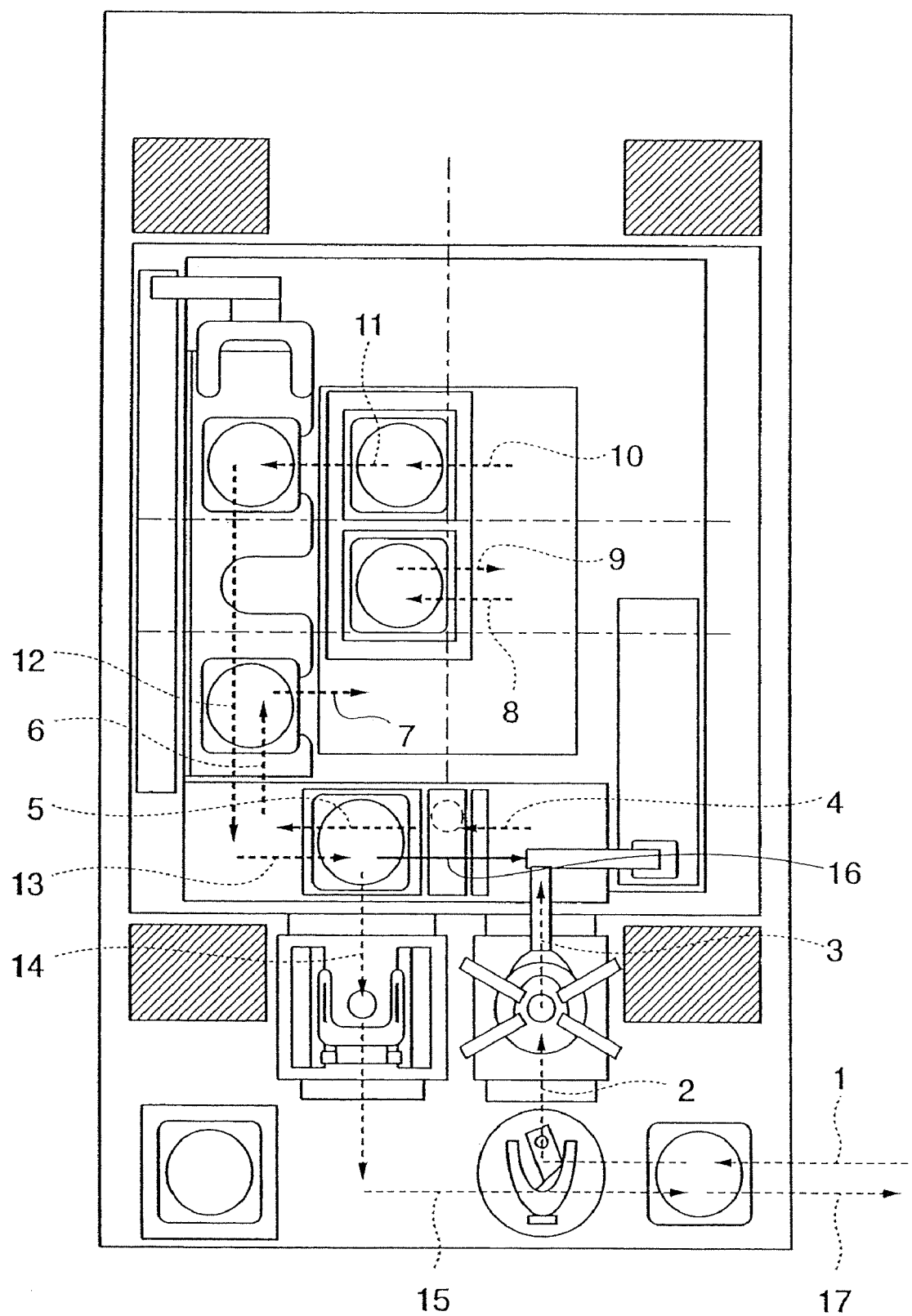
FIG. 11 is a view for explaining the transport operation of a wafer and chuck.

[Transport Operation of Wafer and Chuck (FIG. 11)]

The operations of the units have been described above. Operation of transporting a wafer and chuck by the entire apparatus, in which these operations are combined, will be described with reference to FIG. 11. Reference numerals in FIG. 11 denote the chronological order and correspond to the parenthesized numbers in the following description. Narrow lines indicate wafer movement while wide lines indicate chuck movement.

(1) The wafer is loaded to the loading position 101 by an external apparatus (e.g., a coater/developer).

A temperature adjusting function (not shown) is also arranged at this position. The wafer is made to stand by until its temperature reaches a predetermined value.

(2) The wafer hand 102 loads the wafer from the loading position 101 to the prealignment unit 104 in the loading load-lock chamber 103.

At this time, the wafer hand 102 performs rough alignment using the prealignment sensors 302. Concurrently with the start of nitrogen purge, the edge position of the wafer is measured while the wafer is rotated. On the basis of the measurement result, a notch or orientation flat is made to face in a predetermined rotational direction, and error amounts in the X and Y directions are calculated.

(3) The loading hand 105 moves the wafer from the prealignment unit 104 onto the chuck on the coarse chuck stage 113 of the coarse alignment unit 110. At this time, as for the error amounts in the X and Y directions calculated in (2), the error in the Y direction is corrected by correcting the pick up position of the loading hand while the error in the X direction is corrected by correcting the X position of the coarse chuck stage 113 in wafer mounting. Note that the wafer is transported on the chuck in subsequent operation.

(4) The coarse alignment unit 110 measures the height of the entire wafer surface by using a chuck reference plate as a reference when the coarse chuck stage 113 passes below the coarse focus sensor unit 112 and coarse alignment scope 111. The coarse alignment unit 110 detects the positions of chuck reference marks on the chuck reference plate and prealignment marks in the wafer and performs correction driving with the three wafer support pins 408 such that the prealignment marks on the wafer are located at predetermined positions relative to the chuck reference marks. An error in the θ direction of each chuck reference mark is also corrected by this correction driving.

(5) When the coarse alignment operation ends, the coarse chuck stage 113 moves to the transfer position of the chuck hand 123.

(6) The chuck hand 123 moves the chuck on the coarse chuck stage 113 to the chuck loading position 121 on the loading plate 120 while the chuck holds the wafer thereon. At this time, as for the error amounts in the X and Y directions of the chuck reference marks calculated in (4), the error in the X direction is eliminated by correcting and driving the position of the coarse chuck stage 113 in the X direction in the transfer operation while the error in the Y direction is eliminated by correcting and driving the position of the chuck hand 123 in the Y direction in the transfer operation.

(7) The loading plate 120 moves to the coarse adjustment stage 73 side (apparatus center side) and at this position, moves the chuck from the loading plate 120 onto the fine adjustment top plate 511 on the measurement fine adjustment stage 72. Upon completion of the movement, the loading plate 120 externally retreats from the coarse adjustment stage 73. After that, the measurement fine adjustment stage 72 is subjected to focus/alignment measurement operation, and a detailed description thereof will be given later.

(8) Upon completion of the measurement operation, the loading plate 120 moves to the side of the coarse adjustment stage 73, which temporarily returns the chuck to the loading plate 120.

(9) The coarse adjustment stage 73 passes the chuck to the loading plate 120. The empty coarse adjustment stage 73 moves in a downward direction with respect to the sheet surface of FIG. 11 and receives the chuck from the loading plate 120. With this operation, the chuck having undergone measurement moves from the measurement fine adjustment stage 72 onto the exposure fine adjustment stage 62. After that, the loading plate 120 retreats externally. The chuck having moved to the exposure fine adjustment stage 62 is subjected to exposure operation.

(10) Upon completion of the exposure operation, the loading plate 120 moves again to the coarse adjustment stage 73 side, and the chuck having undergone exposure moves to the chuck unloading position 122 on the loading plate 120.

(11) The chuck having moved to the loading plate 120 externally retreats from the coarse adjustment stage 73 by external movement of the loading plate 120.

(12) The chuck hand 123 returns the chuck having retreated from the coarse adjustment stage 73 to the coarse chuck stage 113 of the coarse alignment unit 110.

(13) The coarse chuck stage 113 moves to the wafer unloading position and at this position, causes the three wafer support pins 408 to extend upward, thereby lifting the wafer from the chuck.

(14) The unloading hand 131 in the unloading load lock chamber 130 recovers the wafer into the unloading load-lock chamber. After the unloading load-lock chamber 130 recovers the wafer, the atmosphere in the unloading load-lock chamber 130 is purged of nitrogen with dry air. Then, the wafer is moved upward by the unloading Z unit 132 at the central portion.

(15) The wafer hand 102 unloads the wafer from the unloading Z unit 132 and moves it to the loading position 101.

(16) In parallel with the operations in (14) and (15), the empty chuck from which the wafer has been removed by the unloading hand 131 moves again to the wafer loading position of the coarse alignment unit and waits until the loading of the next wafer.

(17) The wafer having been returned to the loading position 101 is recovered by an external apparatus.

The operation of the wafer and chuck has sequentially been described mainly from the aspect of a transport operation. The units in an actual exposure apparatus operate in parallel. An explanation with an emphasis on this parallel operation will be given after a description of the operation of the stage unit in, e.g., alignment measurement and exposure.

[Outline of Coarse Alignment (FIG. 12)]

In this embodiment, as described above, the two fine adjustment stages are arranged on the one coarse adjustment stage, thereby performing simultaneous measurement of reference marks on the exposure and measurement chucks, focus measurement on the measurement side to be performed in parallel with exposure operation on the exposure side, and alignment measurement on the measurement side to be performed while the exposure operation on the exposure side is temporarily interrupted. To implement these measurements on the coarse adjustment stage, the following three conditions must be satisfied on the coarse adjustment stage.

(1) Predetermined patterns of a wafer on the exposure fine adjustment stage and those of a wafer on the measurement fine adjustment stage have a predetermined relative positional relationship.

(2) Chuck reference marks on the exposure fine adjustment stage and those on the measurement fine adjustment stage have a predetermined relative positional relationship.

(3) Rough measurement of the height of the wafer on the measurement fine adjustment stage is completed, and tilt correction (global tilt correction) of the entire wafer can be performed.

The semiconductor exposure apparatus of this embodiment performs the following coarse alignment and coarse focus measurement to satisfy the above mentioned conditions.

A coarse measurement system will be explained. Note that part of its description may be repetitive.

Figure 12:
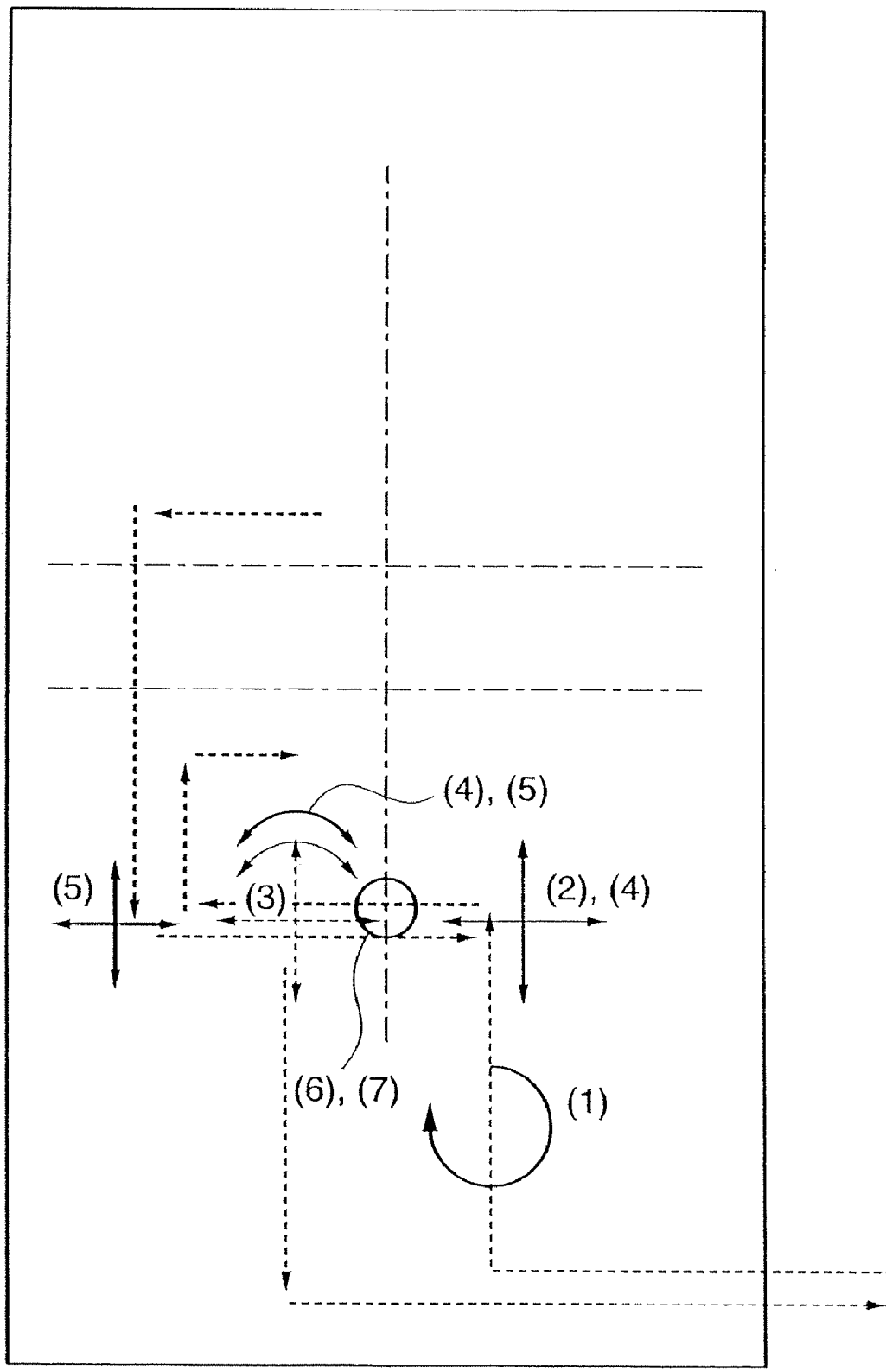
FIG. 12 is a view for explaining the outline of coarse alignment.

The parenthesized numbers in FIG. 12 indicate correction driving positions where coarse alignment is performed and measurement positions where coarse focus measurement is performed in the following description.

(Wafer Coarse Alignment)

Wafer coarse alignment consists of the following three steps, and a unit other than the coarse alignment unit performs part of the operation.

(1) Alignment in Prealignment Unit

When a wafer is to be loaded to the prealignment unit 104, the center of the wafer is set to the almost center of the wafer support unit 309 of the prealignment unit 104. Then, the position of a notch (or orientation flat) is detected, and the wafer is rotated such that the notch faces in a predetermined direction.

(2) Alignment at Wafer Loading Position in Coarse Alignment Unit

Outer shape errors in the X and Y directions after the notch is rotated in a predetermined direction are eliminated at the wafer loading position of the coarse alignment unit. The error in the Y direction is eliminated by correcting the Y position of the loading hand 105 in loading while the error in the X direction is eliminated by correcting the X position of the coarse chuck stage 113 in loading. On the basis of the outer shape measurement result, the wafer is loaded to a position where the positions of prealignment marks in the wafer are located at predetermined positions relative to chuck reference marks.

(3) Prealignment in Coarse Alignment Unit

It is difficult to cause the prealignment marks in the wafer to have a predetermined positional relationship with the chuck reference marks on the basis of only the outer shape measurement result. For this reason, the coarse alignment unit measures the positions of the prealignment marks in the wafer. As needed, the three wafer support pins 408 lift the wafer to align the prealignment marks with the chuck reference marks. The positions of the prealignment marks are measured again. This operation is repeated until a positional shift becomes equal to or smaller than a predetermined tolerance.

Note that above-mentioned operation is performed simultaneously with reference mark measurement and correction driving of an error in the θ direction of a chuck shown in (5) below.

Correction driving for residual error amounts in the X, Y, and θ directions from a predetermined relative position is performed after the chuck is mounted on the measurement fine adjustment stage. The correction driving is performed such that the wafer on the exposure fine adjustment stage and its patterns have a predetermined relative positional relationship in fine alignment measurement on the measurement fine adjustment stage (to be described later).

(Chuck Coarse Alignment)

Chuck coarse alignment includes the following two steps.

(4) Measurement of Reference Mark in Empty Chuck

The empty chuck from which the wafer has been removed by the unloading hand 131 at the wafer unloading position undergoes chuck reference mark position measurement by the coarse alignment scope 111 of the coarse alignment unit 110 and obtains positional shift amounts before loading the next wafer. The positional shift amount in the θ direction is eliminated by rotating the chuck on the coarse chuck stage. The positional shifts in the X and Y directions are eliminated simultaneously with correction of the Y position of the loading hand and the X position of the coarse chuck stage in the wafer loading described above. This reduces a correction amount after wafer loading.

(5) Reference Mark Measurement after Wafer Loading

The positions of the chuck reference marks are measured simultaneously with the wafer prealignment in (3) to obtain positional shift amounts of the chuck. Out of the positional shift amounts, the error in the θ direction is eliminated by finely rotating the coarse chuck stage 113. To eliminate the residual error amounts in the X and Y directions, the Y position of the chuck hand 123 and the X position of the coarse chuck stage 113 are corrected in loading the chuck to the chuck loading position 121 on the loading plate 120. With this operation, the chuck reference marks are located at predetermined positions on the chuck loading position 121.

A residual error amount in the θ direction after fine rotation of the coarse chuck stage 113 will be described. The measurement fine adjustment stage 72 is rotated in an opposite direction by the residual error amount in loading the chuck to the measurement fine adjustment stage 72 and is returned to the original position after the chuck loading. This reduces the residual error amount in the θ direction after loading the chuck to the measurement fine adjustment stage 72.

(Wafer Coarse Focus Measurement)

Wafer coarse focus measurement is performed as follows.

(6) As described in [Outline of Arrangement and Operation of Coarse Alignment Unit], the coarse alignment unit 110 measures the height of the upper surface of the wafer at each position in the X and Y directions. The average focus plane (global focus plane) of the wafer with reference to a chuck reference plane (to be described later) is calculated from a measurement value of the height and the chuck reference plane. After the wafer is loaded onto the measurement fine adjustment stage 72, the measurement fine adjustment stage is driven in the height and tilt directions such that the global focus plane coincides with the measurement image plane of the alignment scope 5 of a measurement unit and the measurement height of a focus measurement unit (focus detection system) 6. This can narrow the measurement range of the focus measurement unit and can increase the focus measurement precision. Additionally, this can minimize a correction driving amount after the measurement and can minimize driving errors. In alignment measurement as well, this can minimize focus shifts generated upon wafer movement and can increase the alignment precision.

Such a height measurement value is also used to align the upper surface of the wafer on the measurement image plane of the alignment scope in the wafer prealignment measurement.

(Chuck Coarse Focus Measurement)

Chuck coarse focus measurement is performed as follows.

(7) As described in [Outline of Arrangement and Operation of Coarse Alignment Unit], the coarse alignment unit 110 measures in the height direction the upper surfaces of the four chuck reference plates 600 on the edges of the chuck. After the chuck is loaded onto the measurement fine adjustment stage, the measurement unit of the coarse adjustment stage measures the heights of three or more chuck reference plates, thereby obtaining the chuck reference plane. The global focus plane of the wafer is calculated and aligned with reference to the position of the reference plane.

Note that such a height measurement value is also used to align the upper surfaces of the reference marks on the measurement image plane of the alignment scope in the reference mark measurement.

[Outline of Chuck Reference Mark (FIG. 13)]

Figure 13:
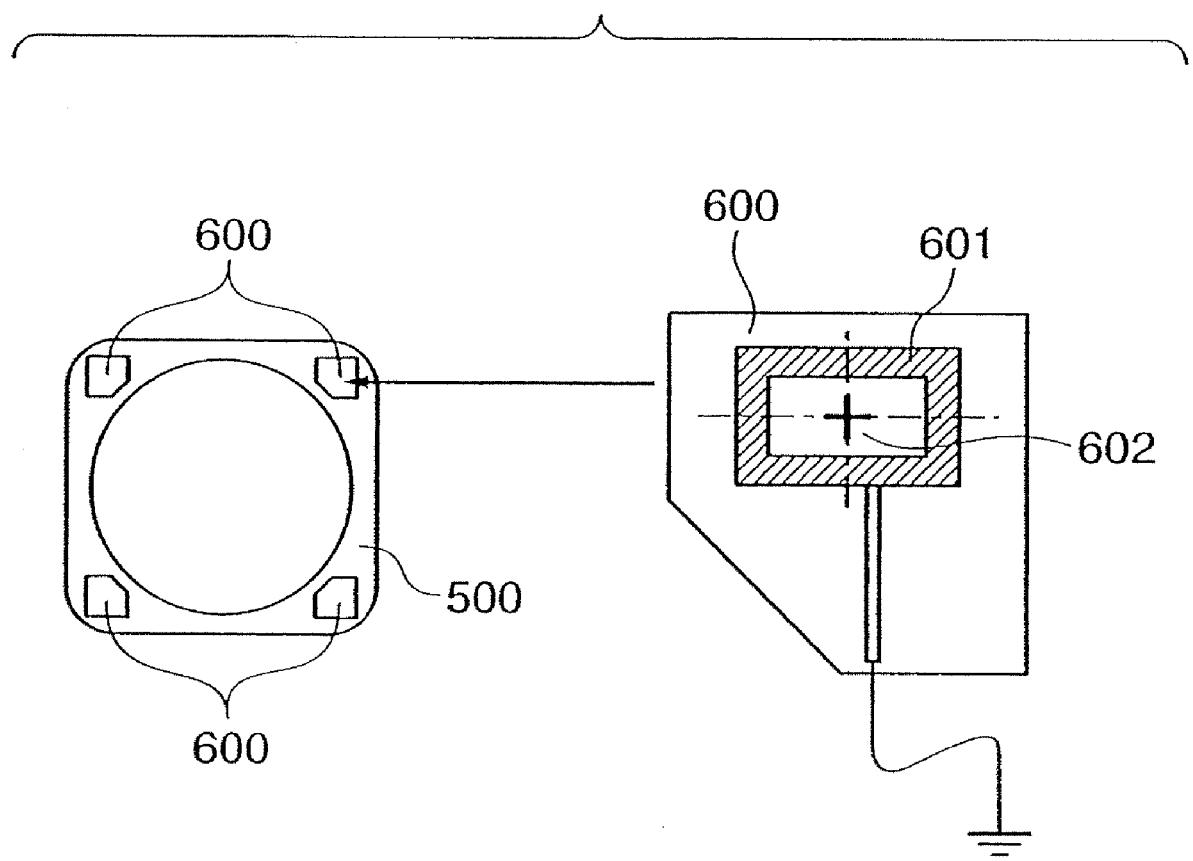
FIG. 13 is a view for explaining a chuck reference mark.

FIG. 13 shows a chuck reference mark.

In FIG. 13, reference numeral 500 denotes the chuck; 600, the chuck reference plates arranged at predetermined positions at four corners of the chuck 500; 601, measurement areas for electrostatic capacitance sensors which measure the heights of the chuck reference plates; and 602, chuck reference marks located on the chuck reference plates.

In the exposure apparatus of this embodiment, the chuck reference plates are arranged at the four corners of the chuck 500, as shown in FIG. 13. Each chuck reference plate is made of quartz and has the measurement area 601 for the electrostatic capacitance sensor on its surface. The measurement area 601 is a conductive pattern and is connected to a ground position in the exposure apparatus such that the electrostatic capacitance sensor can perform high-precision and high-stability measurement. The position of the upper surface of the measurement area is used as a reference of the height of the chuck. The height is measured by a plurality of electrostatic capacitance sensors attached to the lower surface of the projection system at an exposure position and the lower surface of the alignment scope of the measurement unit at a measurement position.

[Outline of Exposure and Focus/Alignment Operations (FIG. 14)]

As one of the characteristic features of the exposure apparatus of this embodiment, exposure and measurement operations are performed in parallel on two fine adjustment stages on one coarse adjustment stage.

Operation on the coarse adjustment stage will be described below.

Figure 14:
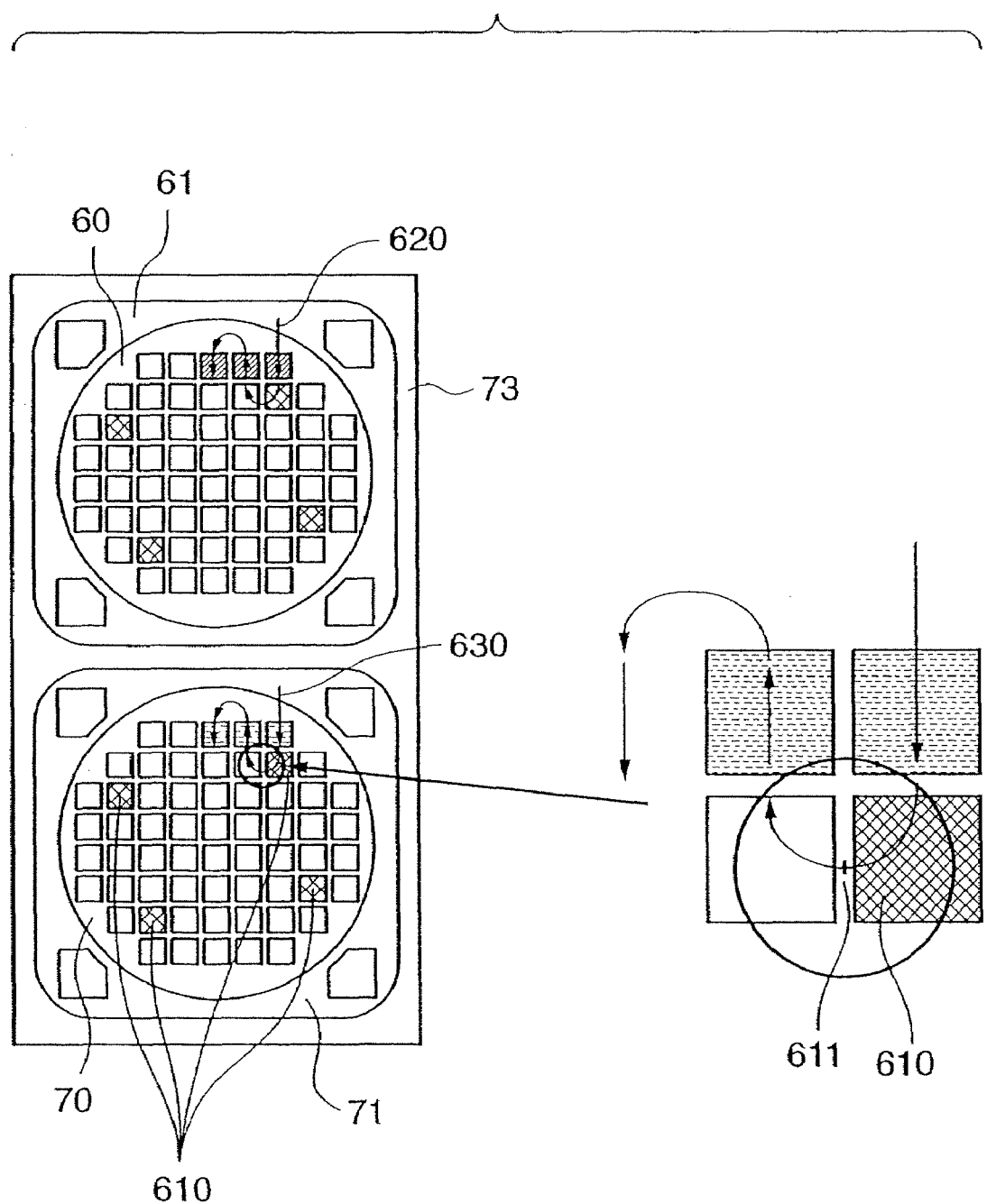
FIG. 14 is a view for explaining the outline of exposure and focus/alignment operations.
Figure 15:
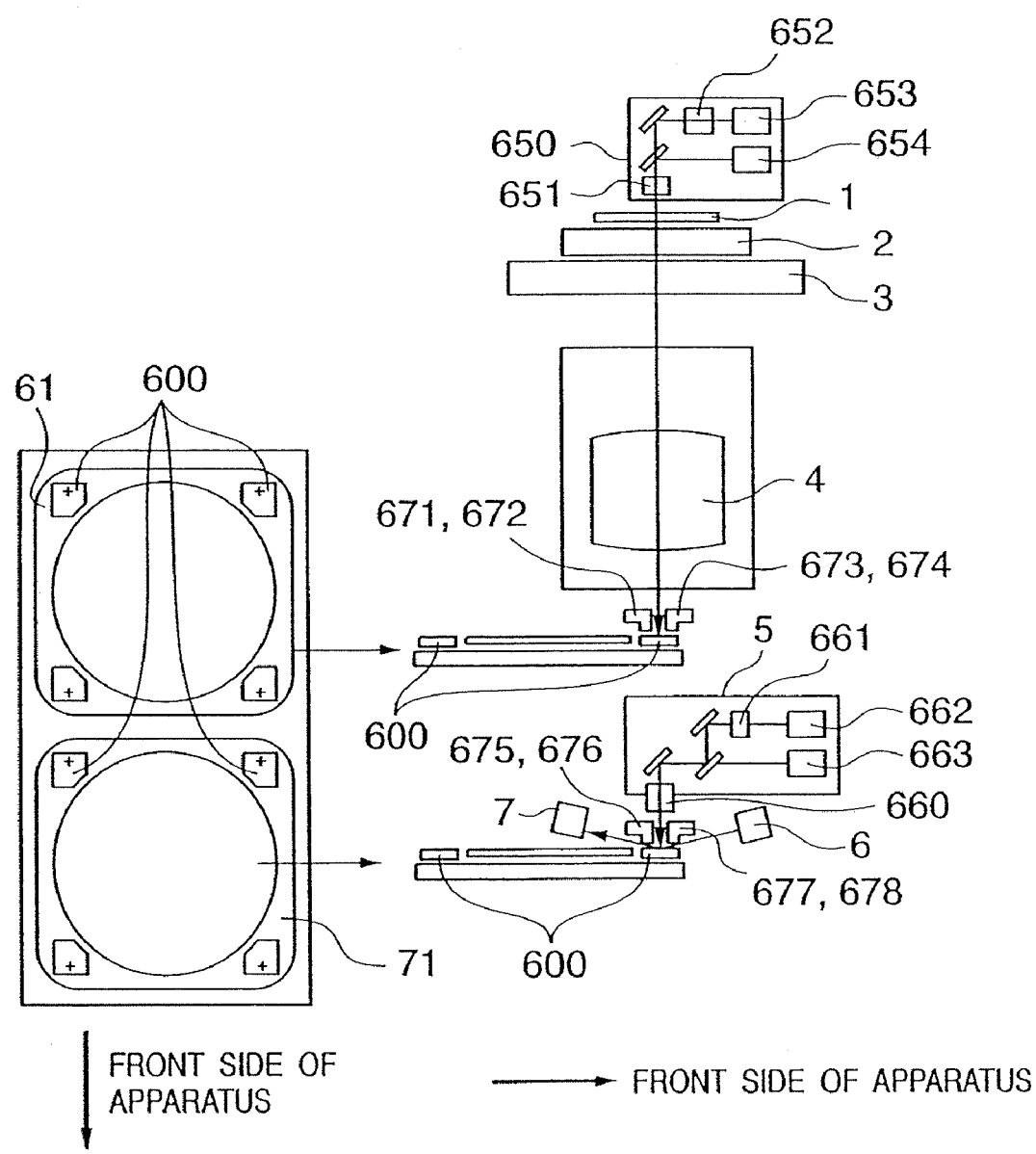
FIG. 15 is a view for explaining the outline of a chuck reference mark measurement operation.
Figure 16A:
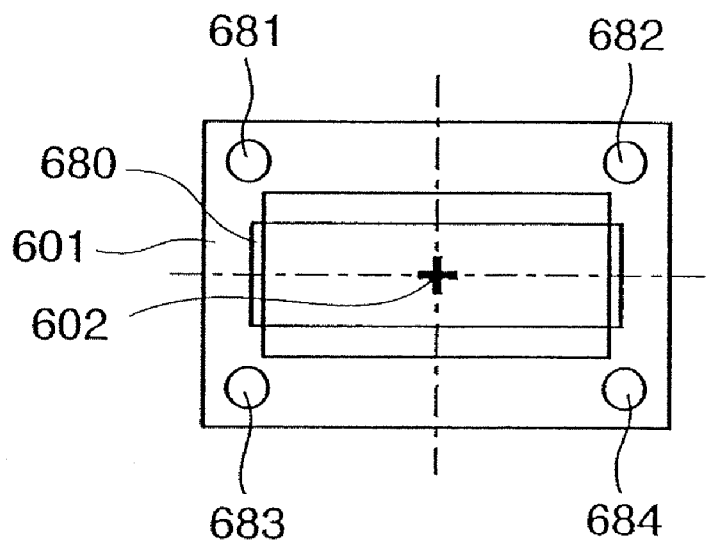
FIG. 16A is a view for explaining an exposure focus measurement region.

FIG. 14 shows the outline of focus/alignment operations; FIG. 15, the outline of chuck reference mark measurement operation; FIG. 16A, the focus measurement region of a chuck reference mark on the exposure side; and FIG. 16B, the focus measurement region of a chuck reference mark on the measurement side.

In FIG. 14, reference numeral 60 denotes the exposure wafer on the exposure chuck 61; 70, the measurement wafer on the measurement chuck 71; 610, alignment shots which need alignment measurement; 611, an alignment mark for fine alignment measurement located near the alignment shot 610; 620, an exposure path of the exposure wafer 60; and 630, a measurement path of the measurement wafer 70. In FIG. 15, reference numeral 650 denotes an alignment scope which can simultaneously measure a reticle and chuck reference marks; 651, an objective lens of the alignment scope 650; 652, a low magnification measurement expander of the alignment scope 650; 653, a low-magnification measurement CCD camera of the alignment scope 650; 654, a high-magnification measurement CCD camera of the alignment scope 650; 5, the alignment scope arranged at an off-axis position; 660, an objective lens of the alignment scope 5; 661, a low-magnification measurement expander of the alignment scope 5; 662, a low-magnification measurement CCD camera of the alignment scope 5; 663, a high-magnification measurement CCD camera of the alignment scope 5; 671 to 674, small electrostatic capacitance sensors arranged around the image plane of the projection system 4 to measure the positions of the upper surfaces of the corresponding chuck reference plates at an exposure position; and 675 to 678, small electrostatic capacitance sensors arranged around the measurement position of the alignment scope 5 so as to have the same positional relationship as that of the electrostatic capacitance sensors 671 to 674 to measure the positions of the upper surfaces of the corresponding chuck reference plates at a measurement position.

Note that the measurement image plane of the alignment scope 650 is located at almost the center of the measurement ranges of the electrostatic capacitance sensors 671 to 674. The measurement image plane of the alignment scope 5 is located at almost the center of the measurement ranges of the electrostatic capacitance sensors 675 to 678.

In FIG. 16A, reference numeral 680 denotes an exposure region size which indicates the size of an exposure region; and 681 to 684, measurement points of electrostatic capacitance sensors S1 to S4 arranged on the lower surface of the projection system 4 at the exposure position.

Figure 16B:
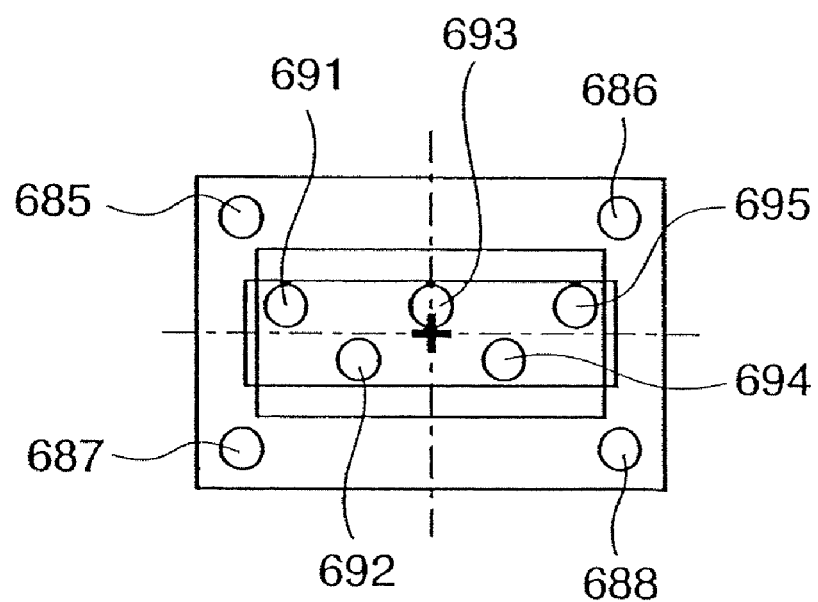
FIG. 16B is a view for explaining a measurement focus measurement region.

In FIG. 16B, reference numerals 685 to 688 denote measurement points of electrostatic capacitance sensors S5 to S8 arranged on the lower surface of the alignment scope 5 at the measurement position. Reference numerals 691 to 695 denote measurement points of focus sensors R1 to R5 arranged on the lower surface of the alignment scope 5 at the measurement position.

FIG. 15 shows only one focus detection system 6 and only one focus detection system 7. In practice, five detection systems 6 and five detection systems 7 are provided in a direction perpendicular to the sheet surface of FIG. 15. The measurement points 691 to 695 of the focus sensors R1 to R5 correspond to detection positions of these detection systems.

(Outline of Operation)

(1) First Reference Mark Measurement at Measurement Position

In the semiconductor exposure apparatus of this embodiment, when the measurement chuck 71 is mounted on the measurement fine adjustment stage 72 on the coarse adjustment stage 73, the coarse adjustment stage 73 is driven in the X and Y directions. This driving is performed such that the chuck reference mark 602 of the upper right chuck reference plate out of the chuck reference plates 600 on the exposure chuck 61 and the chuck reference mark 602 on the upper right chuck reference plate out of the chuck reference plates 600 on the measurement chuck 71 simultaneously fall within the measurement areas of the alignment scope 650 and alignment scope 5, respectively.

At this time, as for the heights of the reference plates at the four corners of the measurement chuck 71, the reference plane for the reference plates is calculated from the measurement results of the reference plates at the four corners by the coarse alignment unit. The measurement fine adjustment stage 72 drives the measurement chuck 71 in the height and tilt directions before the reference mark position measurement such that the reference plane coincides with the measurement image plane of the alignment scope 5.

The electrostatic capacitance sensors S5 to S8 precisely measure in advance the heights of the reference plates of the exposure chuck 61 while the chuck is on the measurement fine adjustment stage 72. Hence, the exposure fine adjustment stage 62 drives the exposure chuck 61 in the height and tilt directions on the basis of the measurement result before the reference mark position measurement such that the upper surfaces of the reference plates coincide with the measurement image plane of the alignment scope 650.

With the above-mentioned operation, the observation plane of each reference plane is located at the measurement image plane of the corresponding alignment scope.

After that, at the measurement position, the electrostatic capacitance sensors S5 to S8 arranged around the measurement image plane of the alignment scope 5 perform precise height measurement of the reference plates and perform correction driving in the height direction for the measurement fine adjustment stage such that the upper surfaces of the reference plates accurately coincide with the measurement image plane of the alignment scope 5. Then, the alignment scope 5 precisely measures the reference marks.

At the exposure position, in parallel with the above-mentioned operation, the electrostatic capacitance sensors S1 to S4 arranged around the measurement image plane of the alignment scope 650 perform precise height measurement of the reference plates and perform correction driving in the height direction for the exposure fine adjustment stage such that the upper surfaces of the reference plates accurately coincide with the measurement image plane of the alignment scope 650. Then, the alignment scope 650 precisely measures the reference marks.

The alignment scopes 5 and 650 perform position measurement using input images from the high-magnification measurement CCD cameras 663 and 654 and, at the same time, perform measurement using the low-magnification measurement CCD cameras 662 and 653. If each reference mark falls outside a high-magnification measurement range, the coarse adjustment stage 73 and the exposure fine adjustment stage 62 or measurement fine adjustment stage 72 is driven such that the reference mark falls within the high-magnification measurement range.

(2) Second Reference Mark Measurement at Measurement Position

The coarse adjustment stage is driven such that the chuck reference mark 602 of the lower right chuck reference plate out of the chuck reference plates 600 on the exposure chuck 61 and the chuck reference mark 602 on the lower right chuck reference plate out of the chuck reference plates 600 on the measurement chuck 71 simultaneously fall within the measurement areas of the alignment scope 650 and alignment scope 5, respectively. Then, measurement similar to (1) is performed.

(3) Third Reference Mark Measurement at Measurement Position

The coarse adjustment stage is driven such that the chuck reference mark 602 of the lower left chuck reference plate out of the chuck reference plates 600 on the exposure chuck 61 and the chuck reference mark 602 on the lower left chuck reference plate out of the chuck reference plates 600 on the measurement chuck 71 simultaneously fall within the measurement areas of the alignment scope 650 and alignment scope 5, respectively. Then, measurement similar to (1) and (2) is performed.

After the above-mentioned operation, at the measurement position, the precise X and Y positions of each chuck reference mark 602 of the measurement chuck 71 and the reference plane for the reference mark are calculated while at the exposure position, the precise X and Y positions of each chuck reference mark 602 of the exposure chuck 61 and the reference plane for the reference mark are calculated.

(4) Exposure and Focus Measurement

With the above-mentioned operation, precise position measurement is completed for the chuck reference marks of the measurement chuck 71 and exposure chuck 61. As indicated by the exposure path 620 of FIG. 14, operation of the coarse adjustment stage causes the exposure chuck 61 to start exposure operation.

In the exposure operation, various correction operations are performed using results of focus and alignment measurements obtained in advance by the measurement unit. A detailed description will be given after the chuck of the measurement unit is moved to the exposure unit.

In parallel with the exposure operation of the exposure chuck 61, the measurement side performs focus measurement of a measurement shot of the wafer on the measurement chuck 71, which is located at the same position of an exposure shot on the wafer on the exposure chuck 61. At this time, since the height of the wafer on the measurement chuck 71 is obtained in advance from the measurement result by the coarse focus sensor unit, the global focus plane of the wafer is calculated. The measurement fine adjustment stage 72 drives the measurement chuck 71 in the height and tilt directions such that the global focus plane coincides with the measurement position of the focus detection system 7 before the focus measurement. This allows high-precision focus measurement of the entire wafer.

Before the focus measurement, the measurement fine adjustment stage 72 is also driven such that the position of a specific pattern of the wafer on the measurement chuck 71 and that of a specific pattern of the wafer on the exposure chuck 61 have a predetermined positional relationship.

This operation is required to always set focus measurement points on the wafer at predetermined positions and attain high precision focus measurement. This operation is also required to align the alignment mark 611 within the measurement region in high-magnification measurement by the alignment scope 5 at the time of alignment measurement during exposure (to be described later) and perform precise position measurement.

This operation is performed by calculating the target driving position of the measurement fine adjustment stage 72 from the measurement results of the positions of the chuck reference marks and the prealignment marks in the wafer obtained in advance by the coarse alignment unit 110 and the measurement results of the chuck reference mark positions described in (1) to (3).

(5) Exposure and Alignment Measurement

As described above, exposure for the wafer on the exposure chuck 61 and focus measurement for the wafer on the measurement chuck 71 are performed in parallel. When each alignment shot 610 comes to near a position where the focus measurement is performed, scan exposure operation is temporarily stopped. High magnification measurement of the alignment scope 5 performs precise position measurement for the alignment mark 611 of the alignment shot 610.

The coarse adjustment stage 73 is temporarily stopped for the alignment measurement. The semiconductor exposure apparatus of this embodiment follows the measurement path 630 shown in FIG. 14, i.e., switchbacks in the Y direction and needs to stop temporarily.

The semiconductor exposure apparatus of this embodiment temporarily stops in the X direction in the temporary stop operation in the Y direction and performs precise position measurement of the wafer on the measurement chuck 71. The semiconductor exposure apparatus can minimize the time necessary for alignment measurement operation.

In FIG. 14, alignment measurement is performed for a measurement shot not having undergone focus measurement. When a measurement shot having undergone focus measurement comes to near the measurement position during exposure operation, the same operation may be performed.

In this case, use of focus measurement data for each shot enables not focus alignment of only the global focus plane but more accurate focus alignment for alignment shots, thereby allowing more precise alignment measurement.

(6) Last Reference Mark Measurement

Upon completion of exposure of the wafer on the exposure chuck 61 and focus and alignment measurements of the wafer on the measurement chuck 71, the coarse adjustment stage operates to move the chuck reference marks on the exposure chuck 61 and the chuck reference marks on the measurement chuck 71 below the alignment scopes 650 and 5. High-magnification measurement of each alignment scope confirms whether the exposure and measurement operations cause any positional shift of each chuck. If the measurement result detects a shift amount of a predetermined tolerance or more, each chuck is recovered to the loading plate 120. In this state, nitrogen for cleaning is ejected from each fine adjustment stage to perform cleaning.

When the positional shift amount approaches the predetermined tolerance, a warning is issued. If the positional shift amount is too large to correct by the cleaning, the apparatus stops abnormally.

(7) Movement from Measurement Fine Adjustment Stage to Exposure Fine Adjustment Stage When all the measurements at the measurement position are completed, the coarse adjustment stage moves to the right rear. The loading plate 120 moves to the coarse adjustment stage side (right side) and reaches the upper portion of the right half of the coarse adjustment stage. The two fine adjustment stages on the coarse adjustment stage 73 are moved at a normal height to the left rear and are fit into the loading plate 120.

At this position, each fine adjustment stage turns off the Vac. of the corresponding chuck and moves downward, thereby moving the chuck onto the loading plate 120. Then, the coarse adjustment stage 73 is moved to the left front, and at this position, each fine adjustment stage is moved upward. With this operation, unloading of a chuck holding a wafer having undergone exposure, movement of a chuck holding a wafer having undergone measurement from the measurement fine adjustment stage 72 to the exposure fine adjustment stage 62, and loading of a chuck holding a wafer to be measured next onto the measurement fine adjustment stage 72 are performed.

A detailed description will be given in [Outline of Operation of Wafer Stage Unit (FIGS. 17 to 20)].

(8) First Reference Mark Measurement at Exposure Position

Operation at the exposure position described in "(1) First Reference Mark Measurement at Measure Position" is performed.

(9) Second Reference Mark Measurement at Exposure Position

Operation at the exposure position described in "(2) Second Reference Mark Measurement at Measure Position" is performed.

(10) Third Reference Mark Measurement at Exposure Position

Operation at the exposure position described in "(3) Third Reference Mark Measurement at Measure Position" is performed.

(11) Exposure

An explanation of various correction operations in exposure is omitted from "(4) Exposure and Focus Measurement" and will be given below.

The positions of the upper surface of the wafer to be exposed at the X and Y positions and the positions of the alignment marks of the alignment shots on the wafer with reference to the chuck reference marks are obtained from the measurement results obtained in (1) to (5).

When each of the positions of the upper surface of the wafer at the X and Y positions comes to the exposure position, the exposure fine adjustment stage 62 drives the wafer such that the position accurately coincides with the exposure image plane of the projection system 4.

The measurement result of the position of each alignment mark is decomposed after the measurement into wafer position errors in the X, Y, and θ directions, a wafer magnification error, an X-Y array orthogonality error, and the like. These errors are corrected by the coarse adjustment stage 73 in exposure, the position of the exposure fine adjustment stage 62, the scan rates of the reticle and wafer, magnification correction of the projection system, and the like.

[Outline of Operation of Wafer Stage Unit (FIGS. 17 to 20)]

The semiconductor exposure apparatus of this embodiment performs exposure and measurement operations in parallel on one coarse adjustment stage. This parallel operation will be described below in detail.

Figure 17:
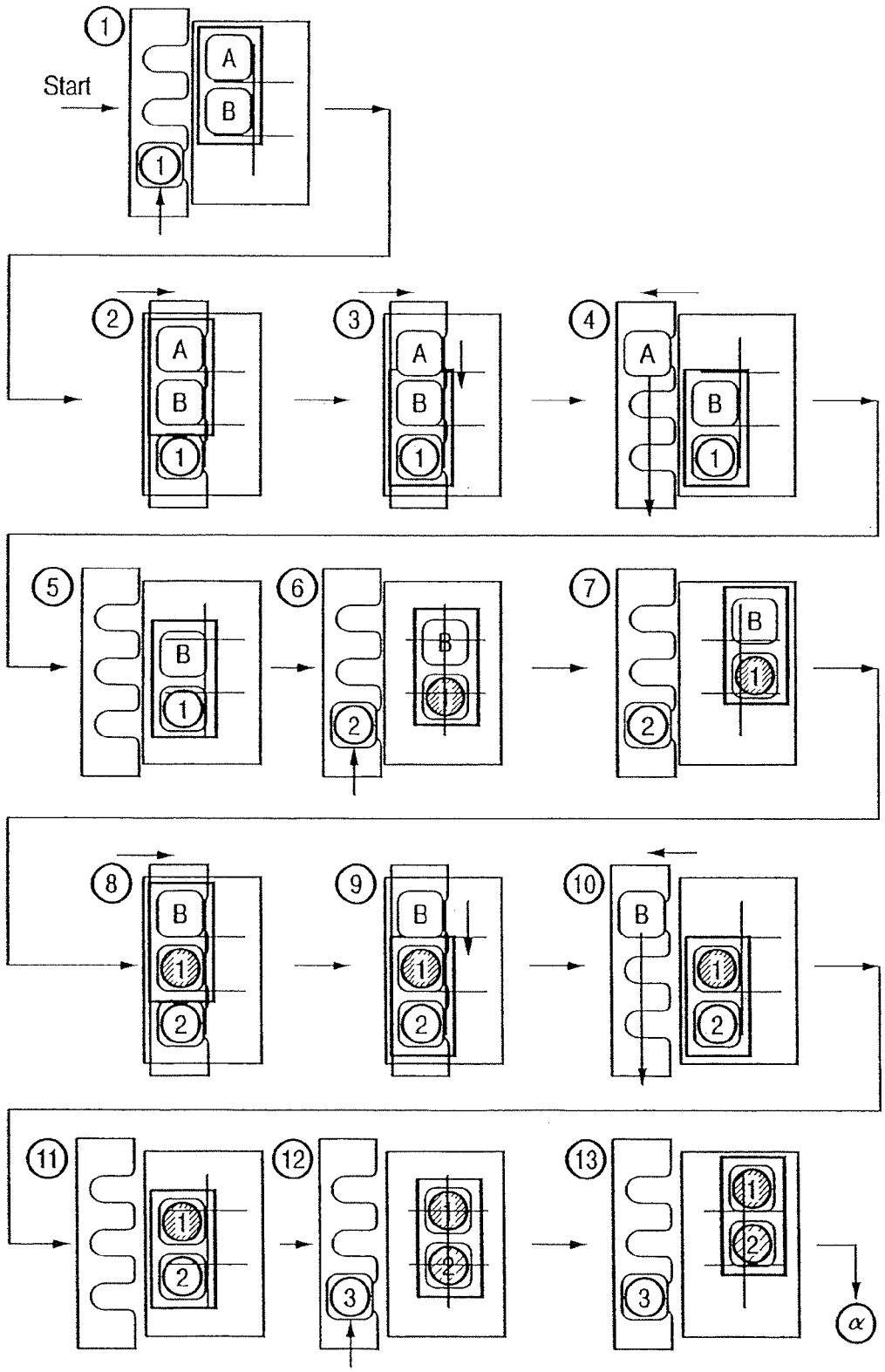
FIGS. 17 to 19 are views for explaining the outline of operation of a wafer stage unit.
Figure 18:
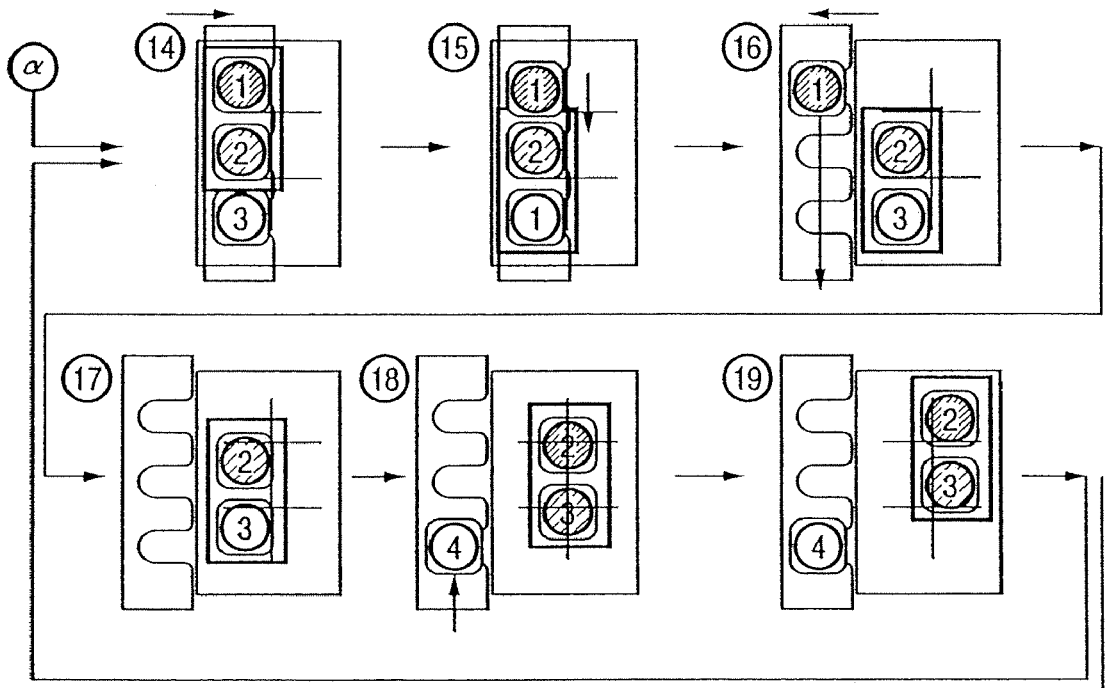
Figure 18:
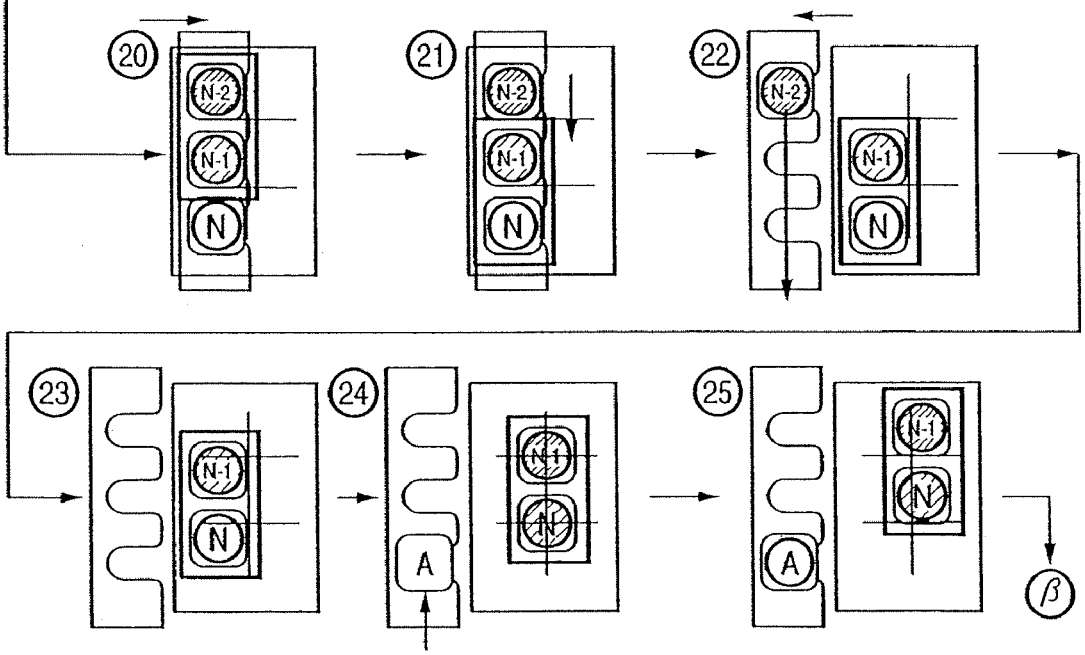
Figure 19:
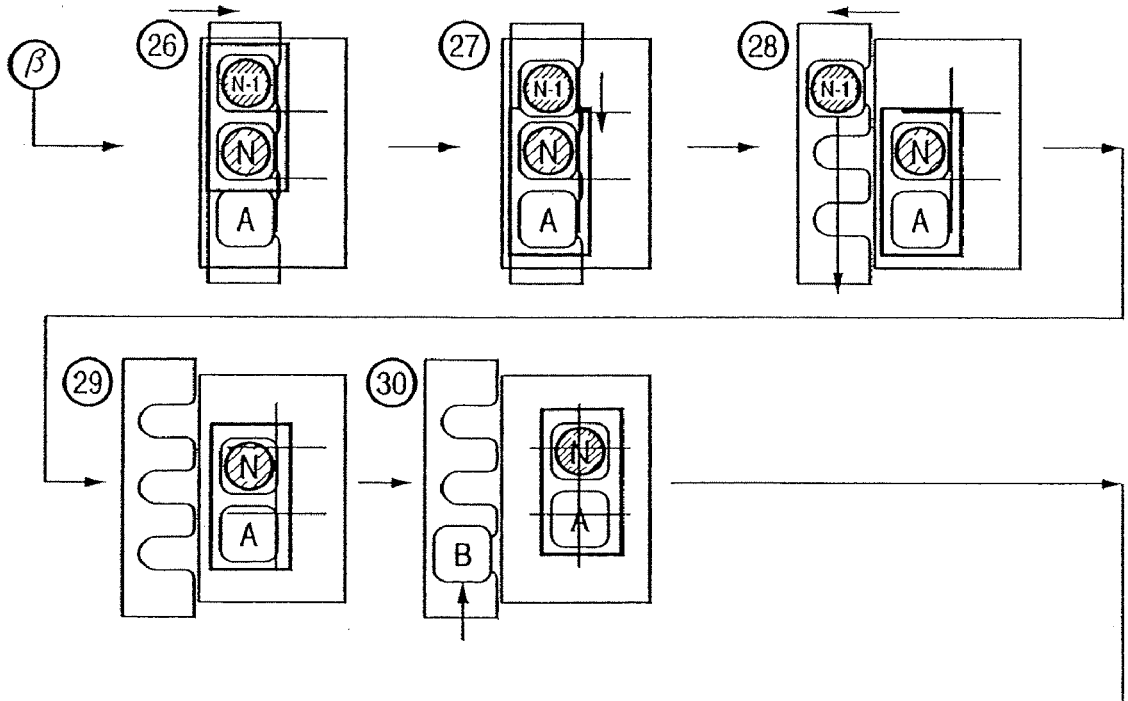
Figure 19:
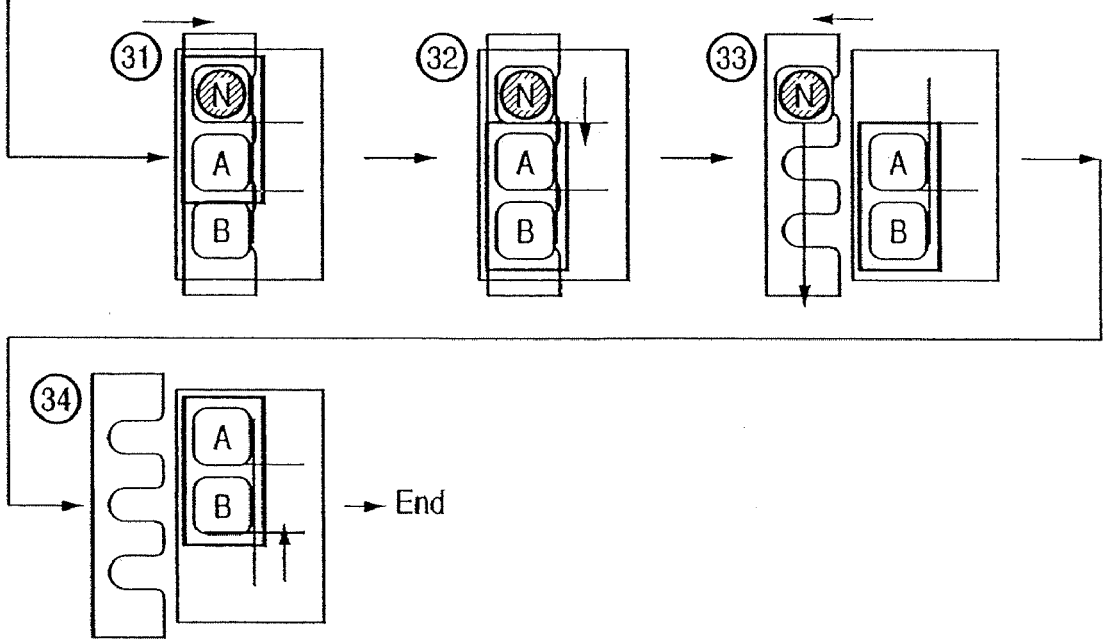

FIGS. 17 to 19 show the outline of operation of a wafer stage. In FIGS. 17 to 19, reference symbols A and B denote empty chucks, and a chuck on which a wafer is mounted bears the number of the wafer.

Figure 20:
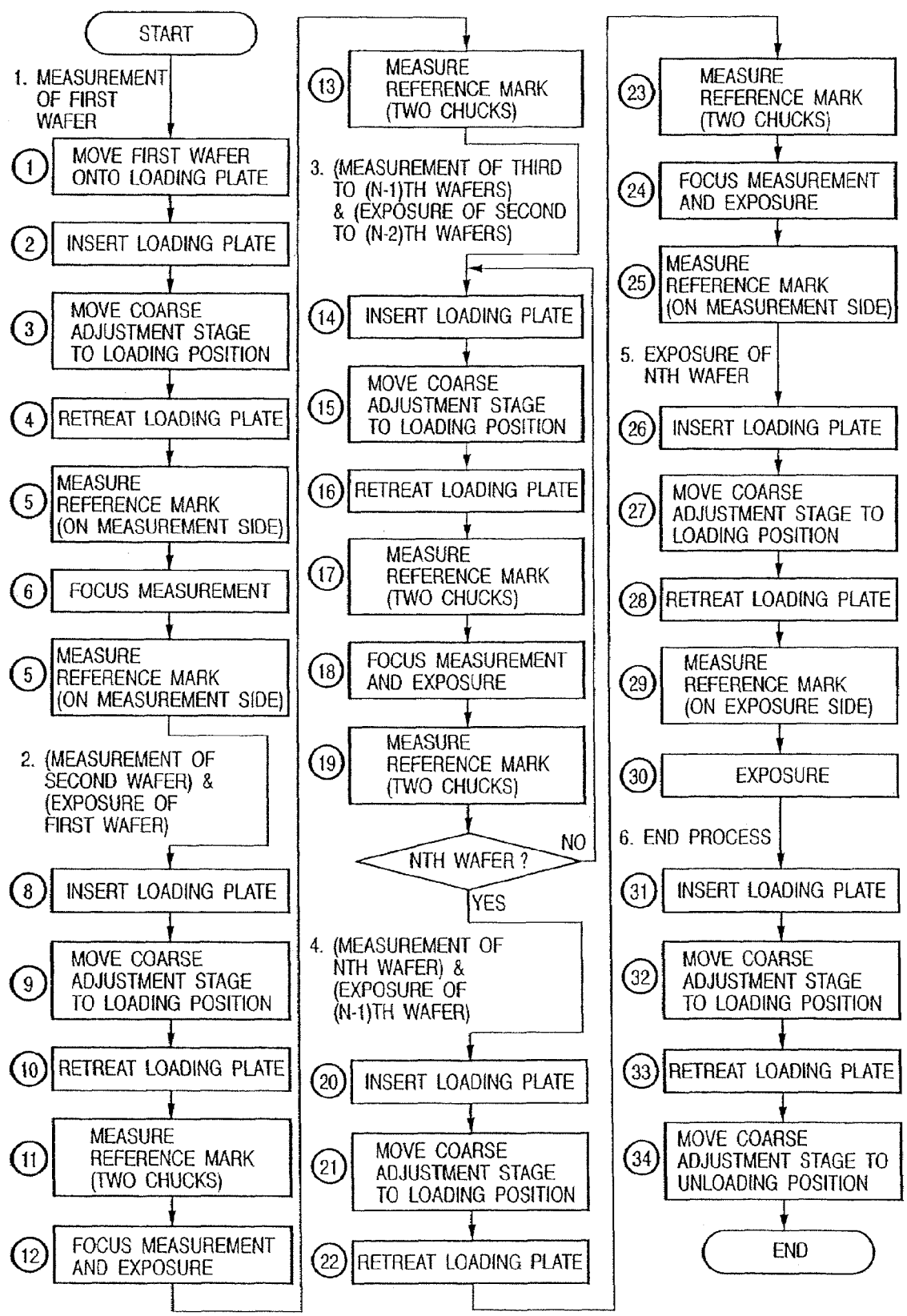
FIG. 20 is a flow chart showing the operation flow of the wafer stage unit.

Note that a chuck holding wafer No. 1 will be referred to as chuck No. 1 hereinafter. FIG. 20 is the operation flow of FIGS. 17 to 19. The circled process numbers are the same as those shown in FIGS. 17 to 19.

(Outline of Operation)

The sequence from the beginning to the end of the wafer process of the semiconductor exposure apparatus according to this embodiment is mainly divided into the following six blocks in the case of N wafers.

(1) Measurement of First Wafer
(2) (Measurement of Second Wafer) & (Exposure of First Wafer)
(3) (Measurement of Third to (N–1)th Wafers) & (Exposure of Second to (N–2)th Wafers)
(4) (Measurement of Nth Wafer) & (Exposure of (N–1)th Wafer)
(5) Exposure of Nth Wafer
(6) End Process These blocks will be explained below in detail.

(1) Measurement of First Wafer

No. 1: Movement of First Wafer onto Loading Plate

The semiconductor exposure apparatus of this embodiment incorporates three chucks, which stand by at the following positions in their initial states.

At the wafer loading position on the coarse alignment unit 110

On the exposure fine adjustment stage 62

On the measurement fine adjustment stage 72

Upon completion of coarse alignment in the coarse alignment unit 110, the first wafer is loaded at the chuck loading position 121 on the loading plate 120 by the chuck hand 123, as shown in FIG. 17. Note that the chuck hand 123 retreats and stands by at the rearmost position.

No. 2: Insertion of Loading Plate

The loading plate 120 is inserted into the coarse adjustment stage 73. The coarse adjustment stage moves to the unloading position (left rear) while the exposure fine adjustment stage 62 and measurement fine adjustment stage 72 are kept elevated, and the fine adjustment stages move downward. With this operation, the empty chucks A and B move onto the loading plate 120.

No. 3: Movement of Coarse Adjustment Stage to Loading Position

After the empty chucks A and B are passed to the loading plate 120, the coarse adjustment stage 73 moves from the unloading position (left rear) to the loading position (left front). At this position, the exposure fine adjustment stage 62 and measurement fine adjustment stage 72 move upward. The empty chuck B is coupled to the exposure fine adjustment stage 62 while chuck No. 1 holding the first process wafer is coupled to the measurement fine adjustment stage 72.

No. 4: Retreat of Loading Plate

The loading plate 120 externally retreats from the coarse adjustment stage 73, and movement of the empty chuck B and chuck No. 1 to the coarse adjustment stage 73 completes. The empty chuck A on the loading plate 120 is unloaded by the chuck hand 123 to the coarse alignment unit 110.

No. 5: Reference Mark Measurement (on Measurement Side)

The electrostatic capacitance sensors S5 to S8 on the measurement side measure the upper surfaces of the chuck reference plates on chuck No. 1, and at the same time, the focus detection system 7 performs focus measurement. The electrostatic capacitance sensors S5 to S8 and focus detection system 7 perform calibration. The alignment scope (simultaneous measurement at low and high magnifications) on the measurement side measures the chuck reference marks 602 in the chuck reference plates 600 on chuck No. 1.

Though not shown, the two or more chuck reference marks 602 are measured.

No. 6: Focus Measurement

The coarse adjustment stage 73 is driven in the same manner as in actual exposure, and the focus detection system 7 on the measurement side performs focus measurement for the entire upper surface of chuck No. 1.

If an alignment shot comes to near a position where focus measurement is being performed by the alignment scope 5 (high magnification) on the measurement side, alignment measurement is also performed, as shown in FIG. 14.

During this operation, chuck No. 2 is moved to the chuck loading position 121 of the loading plate 120, as shown in FIG. 17.

No. 7: Reference Mark Measurement (on Measurement Side)

After the measurement, the alignment scope 5 (high magnification) on the measurement side measures the chuck reference marks 602 in the chuck reference plates 600 on chuck No. 1.

It is confirmed whether the measurement operation causes any positional shift of the chuck.

(2) (Measurement of Second Wafer) & (Exposure of First Wafer)

No. 8: Insertion of Loading Plate

The loading plate 120 is inserted. Then, the coarse adjustment stage 73 moves to the unloading position (left rear) while the exposure fine adjustment stage 62 and measurement fine adjustment stage 72 are kept elevated, and the fine adjustment stages move downward. With this operation, the empty chuck B and chuck No. 1 are moved onto the loading plate 120.

No. 9: Movement of Coarse Adjustment Stage to Loading Position

After the empty chuck B and chuck No. 1 are passed to the loading plate 120, the coarse adjustment stage 73 moves from the unloading position (left rear) to the loading position (left front).

At this position, the exposure fine adjustment stage 62 and measurement fine adjustment stage 72 move upward. Chuck No. 1 is coupled to the exposure fine adjustment stage 62 while chuck No. 2 holding the second process wafer is coupled to the measurement fine adjustment stage 72.

No. 10: Retreat of Loading Plate

The loading plate 120 externally retreats from the coarse adjustment stage 73, and movement of chuck Nos. 1 and 2 to the coarse adjustment stage 73 completes. The empty chuck B on the loading plate 120 is unloaded by the chuck hand 123 to the coarse alignment unit 110.

No. 11: Reference Mark Measurement (Two Chucks)

On the measurement side, the measurement electrostatic capacitance sensors S5 to S8 measure the upper surfaces of the chuck reference plates on chuck No. 2.

At the same time, the focus detection system 7 performs focus measurement. The electrostatic capacitance sensors S5 to S8 and focus detection system 7 perform calibration. The alignment scope 5 (simultaneous measurement at low and high magnifications) on the measurement side measures the chuck reference marks 602 in the chuck reference plates 600 on chuck No. 2.

Though not shown, the two or more chuck reference marks 602 are measured.

On the exposure side, the exposure electrostatic capacitance sensors S1 to S4 measure the upper surfaces of the chuck reference plates on chuck No. 1 in parallel with the above-mentioned operation.

The alignment scope (simultaneous measurement at low and high magnifications) on the exposure side measures the chuck reference marks 602 in the chuck reference plates 600 on chuck No. 1 to calculate information required for exposure.

No. 12: Focus Measurement and Exposure

The exposure unit starts exposure operation for wafer No. 1.

In parallel with this, the focus detection system 7 on the measurement side performs focus measurement for the entire upper surface of chuck No. 2.

If an alignment shot comes to near a position where focus measurement is being performed by the alignment scope 5 (high magnification) on the measurement side, alignment measurement is also performed for wafer No. 2, as shown in FIG. 14.

During this operation, chuck No. 3 is moved to the chuck loading position 121 of the loading plate 120, as shown in FIG. 17.

No. 13: Reference Mark Measurement (Two Chucks)

After the measurement, the alignment scopes (high magnification) on the exposure and measurement sides measure the chuck reference marks 602 in the chuck reference plates 600 on chuck Nos. 1 and 2.

It is confirmed whether the exposure and measurement operations cause any positional shift of the chucks.

(3) (Measurement of Third to (N−1)th Wafers) & (Exposure of Second to (N−2)th Wafers)

No. 14: Insertion of Loading Plate

The loading plate 120 is inserted. Then, the coarse adjustment stage 73 moves to the unloading position (left rear) while the exposure fine adjustment stage 62 and measurement fine adjustment stage 72 are kept elevated, and the fine adjustment stages move downward. With this operation, chuck Nos. 1 and 2 are moved onto the loading plate 120.

No. 15: Movement of Coarse Adjustment Stage to Loading Position

After chuck Nos. 1 and 2 are passed to the loading plate 120, the coarse adjustment stage 73 moves from the unloading position (left rear) to the loading position (left front).

At this position, the exposure fine adjustment stage 62 and measurement fine adjustment stage 72 move upward. Chuck No. 2 is coupled to the exposure fine adjustment stage 62 while chuck No. 3 holding the third process wafer is coupled to the measurement fine adjustment stage 72.

No. 16: Retreat of Loading Plate

The loading plate 120 externally retreats from the coarse adjustment stage 73, and movement of chuck Nos. 2 and 3 to the coarse adjustment stage 73 completes. Chuck No. 1 having undergone exposure on the loading plate 120 is unloaded by the chuck hand 123 to the coarse alignment unit 110.

No. 17: Reference Mark Measurement (Two Chucks)

Reference mark measurement similar to that in No. 11 is performed for chuck Nos. 3 and 2.

No. 18: Focus Measurement and Exposure

Focus measurement and exposure similar to that in No. 12 is performed for chuck Nos. 3 and 2.

During this operation, chuck No. 4 is moved to the chuck loading position 121 of the loading plate 120, as shown in FIG. 18.

No. 19: Reference Mark Measurement (Two Chucks)

Reference mark measurement similar to that in No. 13 is performed for chuck Nos. 3 and 2.

The above-mentioned operation is repeated until chuck No. N holding the last process wafer is loaded onto the loading plate. The processes to follow are obtained by incrementing the chuck number in Nos. 14 to 19 by one.

(4) (Measurement of Nth Wafer) & (Exposure of (N−1)th Wafer)

No. 20: Insertion of Loading Plate

Chuck Nos. (N−2) and (N−1) are moved onto the loading plate 120. Basically, operation similar to that in No. 14 is performed.

No. 21: Movement of Coarse Adjustment Stage to Loading Position

After chuck Nos. (N−2) and (N−1) are passed to the loading plate 120, the coarse adjustment stage 73 moves from the unloading position (left rear) to the loading position (left front).

At this position, the exposure fine adjustment stage 62 and measurement fine adjustment stage 72 move upward. Chuck No. (N−1) is coupled to the exposure fine adjustment stage 62 while chuck No. N holding the last process wafer is coupled to the measurement fine adjustment stage 72.

No. 22: Retreat of Loading Plate

The loading plate 120 externally retreats from the coarse adjustment stage 73, and the exposure fine adjustment stage 62 and measurement fine adjustment stage 72 move downward. Movement of chuck Nos. (N−1) and N to the coarse adjustment stage 73 completes.

Chuck No. (N−2) having undergone exposure on the loading plate 120 is unloaded by the chuck hand 123 to the coarse alignment unit 110.

No. 23: Reference Mark Measurement (Two Chucks)

Reference mark measurement similar to that in No. 11 is performed for chuck Nos. N and (N−1).

No. 24: Focus Measurement and Exposure

Focus measurement and exposure similar to that in No. 12 is performed for chuck Nos. N and (N−1).

During this operation, the empty chuck A is moved to the chuck loading position 121 of the loading plate 120, as shown in FIG. 18.

No. 25: Reference Mark Measurement (Two Chucks)

Reference mark measurement similar to that in No. 13 is performed for chuck Nos. N and (N−1).

(5) Exposure of Nth Wafer

No. 26: Insertion of Loading Plate

Chuck Nos. (N−1) and N are moved onto the loading plate 120. Basically, operation similar to that in No. 14 is performed.

No. 27: Movement of Coarse Adjustment Stage to Loading Position

After chuck Nos. (N−1) and N are passed to the loading plate 120, the coarse adjustment stage 73 moves from the unloading position (left rear) to the loading position (left front).

At this position, the exposure fine adjustment stage 62 and measurement fine adjustment stage 72 move upward. Chuck No. N is coupled to the exposure fine adjustment stage 62 while the empty chuck A is coupled to the measurement fine adjustment stage 72.

No. 28: Retreat of Loading Plate

The loading plate 120 retreats, and the exposure fine adjustment stage 62 and measurement fine adjustment stage 72 move downward. Movement of chuck No. N and empty chuck A to the coarse adjustment stage 73 completes.

Chuck No. (N−1) having undergone exposure on the loading plate 120 is unloaded by the chuck hand 123 to the coarse alignment unit 110.

No. 29: Reference Mark Measurement (on Exposure Side)

The measurement side bearing the empty chuck does not perform measurement. Only measurement of the chuck reference marks 602 in the chuck reference plates 600 on chuck No. N is performed by the alignment scope 650.

No. 30: Exposure

Exposure of chuck No. N starts. The measurement side bearing the empty chuck does not perform focus measurement and the like.

During this operation, the empty chuck B is moved to the chuck loading position 121 of the loading plate 120, as shown in FIG. 19.

(6) End Process

No. 31: Insertion of Loading Plate

Chuck No. N and the empty chuck A are moved onto the loading plate 120.

No. 32: Movement of Coarse Adjustment Stage to Loading Position

After chuck No. N and the empty chuck A are passed to the loading plate 120, the coarse adjustment stage 73 moves from the unloading position (left rear) to the loading position (left front).

At this position, the exposure fine adjustment stage 62 and measurement fine adjustment stage 72 move upward. The empty chuck A is coupled to the exposure fine adjustment stage 62 while the empty chuck B is coupled to the measurement fine adjustment stage 72.

No. 33: Retreat of Loading Plate

The loading plate 120 retreats, and the exposure fine adjustment stage 62 and measurement fine adjustment stage 72 move downward. Movement of the empty chucks A and B to the coarse adjustment stage 73 completes.

Chuck No. N having undergone the last exposure on the loading plate 120 is unloaded by the chuck hand 123 to the coarse alignment unit 110.

No. 34: Movement of Coarse Adjustment Stage to Unloading Position

The coarse adjustment stage 73 is moved to the unloading position, and the entire wafer process ends.

Operation that pertains to the coarse adjustment stage has been described. In the semiconductor exposure apparatus of this embodiment, both the exposure fine adjustment stage 62 and the measurement fine adjustment stage 72 on the coarse adjustment stage 73 have respective chucks. The coarse adjustment stage is driven only when the chucks are not mounted on the fine adjustment stages. This aims at keeping the weight balance of the coarse adjustment stage constant and maintaining the stable stage performance in high-speed driving.

[Outline of Chuck Unloading Function (FIG. 21)]

Figure 21:
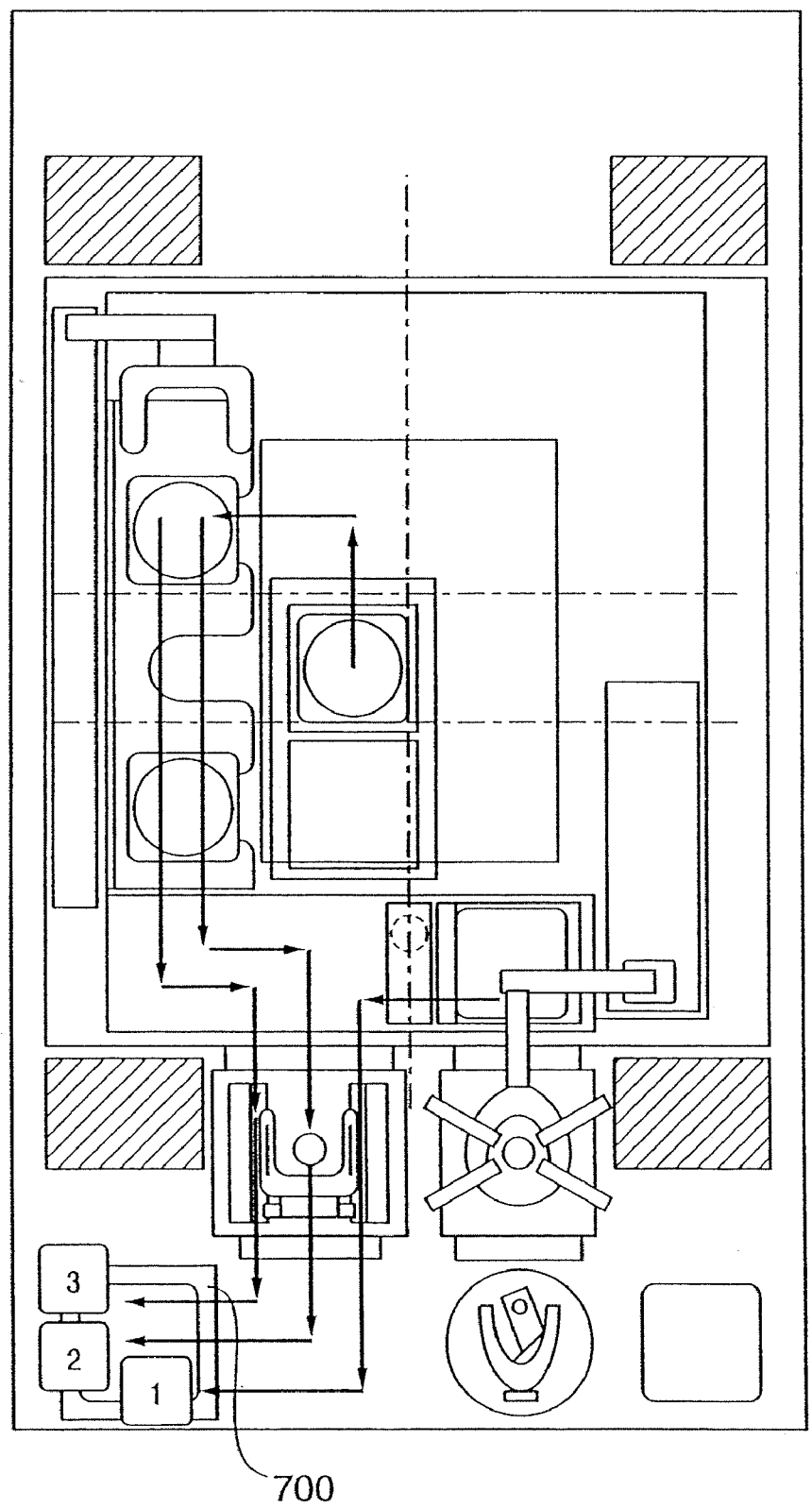
FIG. 21 is a view for explaining chuck unloading.

FIG. 21 shows how a chuck is unloaded. In FIG. 21, reference numeral 700 denotes a chuck cassette which can accommodate a plurality of chucks.

The semiconductor exposure apparatus of this embodiment inserts the hand unit of the unloading hand 131 into the chuck support unit 412 below the chuck 405 and unloads the chuck 405 from the coarse chuck stage 113 to the unloading load-lock chamber 130 at the wafer unloading position of the coarse alignment unit 110.

The chuck 405 having been unloaded to the unloading load-lock chamber 130 is accommodated by the wafer hand 102 in the chuck cassette 700, similarly to a wafer.

FIG. 21 shows an unloading operation. A chuck loading operation can be performed in a reverse order to that shown in FIG. 21.

[Modification]

As modifications of the semiconductor exposure apparatus according to the embodiment of the present invention, the following semiconductor exposure apparatuses can readily be devised:

1. a semiconductor exposure apparatus which uses two chucks;

2. a semiconductor exposure apparatus which uses four or more chucks, further divides each process in transport and prealignment units into smaller processes, and performs the processes in parallel;

3. a semiconductor exposure apparatus which uses a hand to move a chuck from a loading position to the first stage, to move from the first stage to the second stage, and to move from the second stage to an unloading position;

4. a semiconductor exposure apparatus which measures the height of chuck reference plates and that of a wafer by the same sensor; and 5. a semiconductor exposure apparatus in which each measurement fine adjustment stage is fixed to perform measurements whose measurement ranges are wide by focus measurement and alignment systems.

In this case, each measurement system needs to increase the measurement range while maintaining the measurement precision. On the other hand, no interference occurs between two fine adjustment stages due to vibrations.

As has been described above, according to this embodiment, for example, two fine adjustment stages are arranged on one coarse adjustment stage, and part of exposure, focus measurement, and alignment measurement can be performed simultaneously at exposure and measurement positions by operation of the one coarse adjustment stage. This makes it possible to implement a small, high-speed exposure apparatus.

A wafer having undergone measurement on the measurement fine adjustment stage on the one coarse adjustment stage only needs to move onto the adjacent exposure fine adjustment stage. This prevents any positional shift of the wafer after the measurement from a chuck and implements more accurate alignment/focus at the exposure position.

Since a large focus detection system for wafer measurement is spaced apart from below a projection system, this embodiment can produce additional effects. More specifically, constraints on mounting space are relaxed for the focus detection system for wafer measurement. This makes it much easier to improve and maintain the focus detection system for wafer measurement.

In addition, since the focus measurement system need not be arranged below the projection system, constraints on the design of the projection system are relaxed.

A chuck unloading mechanism according to this embodiment can easily and automatically unload or load the chuck to or from the outer air side even when its exposure space is purged with nitrogen or evacuated to a vacuum. This largely shortens a maintenance time and makes it possible to maintain the cleanliness of the space.

OTHER EMBODIMENT

The present invention includes a case wherein the invention is achieved by directly or remotely supplying a program of software that implements a control flow for measurement and exposure operations of the aforementioned embodiment to a system or apparatus, and reading out and executing the supplied program code by a computer of that system or apparatus. In this case, software need not have the form of a program as long as it has the program function.

Therefore, the program code itself installed in a computer to implement the functional process of the present invention using the computer implements the present invention. That is, the scope of the claims of the present invention includes the computer program itself for implementing the functional process of the present invention.

In this case, the form of a program is not particularly limited, and an object code, a program to be executed by an interpreter, script data to be supplied to an operating system (OS), and the like, may be used as long as they have the program function.

As a recording medium for supplying the program, for example, a flexible disk, a hard disk, an optical disk, a magnetooptical disk, an MO, a CD-ROM, a CD-R, a CD-RW, a magnetic tape, a nonvolatile memory card, a ROM, a DVD (DVD-ROM, DVD-R), and the like, may be used.

As another program supply method, the program may be supplied by establishing connection to a home page on the Internet using a browser on a client computer, and downloading the computer program itself of the present invention or a compressed file containing an automatic installation function from the home page onto a recording medium such as a hard disk, or the like. Also, the program code that forms the program of the present invention may be segmented into a plurality of files, which may be downloaded from different home pages. That is, the scope of the claims of the present invention includes a World Wide Web (WWW) server, which makes a plurality of users download a program file required to implement the functional process of the present invention by the computer.

Also, a storage medium such as a CD ROM or the like, which stores the encrypted program of the present invention, may be delivered to the user, the user who has cleared a predetermined condition may be allowed to download key information that decrypts the program from a home page via the Internet, and the encrypted program may be executed using that key information to be installed on a computer, thus implementing the present invention.

The functions of the aforementioned embodiment may be implemented not only by executing the program code read out by the computer, but also by some of or all of actual processing operations executed by an operating system (OS), or the like, running on the computer, on the basis of an instruction of that program.

Furthermore, the functions of the aforementioned embodiment may be implemented by some or all of actual processes executed on the basis of an instruction of that program by a CPU, or the like, arranged in a function extension board or a function extension unit, which is inserted in or connected to the computer, after the program read out from the recording medium is written in a memory of the extension board or unit.

As many apparently widely different embodiments of the present invention can be made without departing from the spirit and scope thereof, it is to be understood that the invention is not limited to the specific embodiments thereof except as defined in the appended claims.

The invention claimed is:

1. An exposure apparatus comprising:
   a measurement unit which performs a measurement operation for a substrate;
   an exposure unit which performs an exposure operation for the substrate;
   a plurality of chucks configured to hold the substrate;
   a base;
   a single coarse adjustment stage which is arranged on the base and movable along the surface of the base;
   first and second fine adjustment stages which are arranged on said coarse adjustment stage, in common, and are movable along the surface of said coarse adjustment stage; and
   a transporting unit which loads at least one chuck among the plurality of chucks, in said first fine adjustment stage, transports the chuck from said first fine adjustment stage to said second fine adjustment stage, and unloads the chuck from said second fine adjustment stage,
   wherein said first and second fine adjustment stages are configured to be able to perform, in parallel, an exposure operation for the substrate held by a chuck mounted on said first fine adjustment stage and a measurement operation for the substrate held by a chuck mounted on said second fine adjustment stage.

2. The exposure apparatus according to claim 1, wherein a distance between said first and second fine adjustment stages corresponds to a distance between said measurement unit and said exposure unit.

3. The exposure apparatus according to claim 1, further comprising a controller which drives said coarse adjustment stage and controls the measurement and exposure operations, wherein said controller controls the measurement and exposure operations for the substrate by serially performing:
   (i) an operation of unloading the substrate having undergone the exposure operation from said first fine adjustment stage while the substrate is held by said chuck;
   (ii) an operation of transporting the substrate having undergone the measurement operation and held by said chuck from said second fine adjustment stage to said first fine adjustment stage, while the substrate is held by said chuck; and
   (iii) an operation of loading a substrate to be subjected to the measurement operation next, while the substrate is held by said chuck,
   wherein said controller controls, in parallel, the exposure operation for the substrate held by said chuck mounted on said first fine adjustment stage and the measurement operation for the substrate held by said chuck mounted on said second fine adjustment stage.

* * * * *